US012696413B2

(12) United States Patent
Hsiao et al.

(10) Patent No.: US 12,696,413 B2
(45) Date of Patent: Jul. 28, 2026

(54) ADAPTER FOR NONSTANDARD OCP MODULE

(71) Applicant: HEWLETT PACKARD ENTERPRISE DEVELOPMENT LP, Spring, TX (US)

(72) Inventors: Chao Lin Hsiao, Taipei City (TW); Chih-Wei Chiang, Taoyuan City (TW); Hsueh-Yu Chao, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 122 days.

(21) Appl. No.: 18/656,919

(22) Filed: May 7, 2024

(65) Prior Publication Data

US 2025/0351287 A1     Nov. 13, 2025

(51) Int. Cl.
H05K 7/14        (2006.01)
G06F 1/186       (2026.01)

(52) U.S. Cl.
CPC ........... H05K 7/1461 (2013.01); G06F 1/186 (2013.01)

(58) Field of Classification Search
CPC ....... H05K 7/1461; G06F 1/186; G06F 1/181; G06F 1/183; G06F 1/185
See application file for complete search history.

(56) References Cited

U.S. PATENT DOCUMENTS

| | | | |
|---|---|---|---|
| 6,208,514 B1 * | 3/2001 | Stark | H05K 7/1431 |
| | | | 361/740 |
| 7,742,291 B2 | 6/2010 | Wu et al. | |
| 10,645,835 B1 | 5/2020 | Sauer et al. | |
| 11,212,933 B2 | 12/2021 | Tsorng et al. | |
| 11,429,160 B2 * | 8/2022 | Tseng | G06F 1/185 |

FOREIGN PATENT DOCUMENTS

CN        218603809 U      3/2023

* cited by examiner

*Primary Examiner* — Imani N Hayman
*Assistant Examiner* — Hung Q Dang
(74) *Attorney, Agent, or Firm* — Jones Burke PLLC

(57)                ABSTRACT

An adapter, a system and a method. The adapter comprising a first card holder configured to be coupled to a first lateral side of a nonstandard Open Compute Project (OCP) module to facilitate installation of the nonstandard OCP module in an OCP bay of an information processing device, the OCP bay comprising a pair of OCP rails comprising grooves, wherein the first card holder comprises: an attachment portion configured to attach to the nonstandard OCP module; and an engagement feature coupled to the attachment portion and movable between an extended position and a retracted position.

12 Claims, 17 Drawing Sheets

ADAPTER FOR NONSTANDARD OCP MODULE

INTRODUCTION

Computing systems that utilize the OCP (open compute project) form factor, and their respective HPMs (Host Processor Module), which is analogous to a motherboard that follows an OCP form factor, often include OCP bays to receive OCP modules. The OCP bays generally have dimensions which complement the standard dimensions of the OCP modules. Customarily these OCP bays may be located at the rear of the system such that an OCP module can be inserted into the OCP bay from outside a chassis of the system through an opening in a rear panel of the system, with the OCP module connecting to an OCP connector at a rear side of the HPM in a parallel orientation relative to the HPM. The dimensions specified by OCP for OCP modules may include specifications such as width, length, and height for the various parts of the module. These OCP module dimension restrictions usually translate to restrictions on the chassis of those systems as well, such as the size of the opening at the rear panel of the chassis.

For example, the opening in the rear panel through which the OCP module is inserted into the OCP bay may have a height and width that complements the OCP standard module dimensions, i.e., the opening may have dimensions large enough to allow a standard OCP module to be inserted therethrough and small enough to allow proper engagement between the rear panel and a faceplate of the OCP module. An OCP module can be easily inserted into this aperture and pushed inwards as to traverse an OCP module guide, or rail, until the module is connected to the OCP bay.

BRIEF DESCRIPTION OF THE DRAWINGS

The present disclosure can be understood from the following detailed description, either alone or together with the accompanying drawings. The drawings are included to provide a further understanding of the present disclosure and are incorporated in and constitute a part of this specification. The drawings illustrate one or more examples of the present teachings and together with the description explain certain principles and operation. In the drawings.

Figure 1:
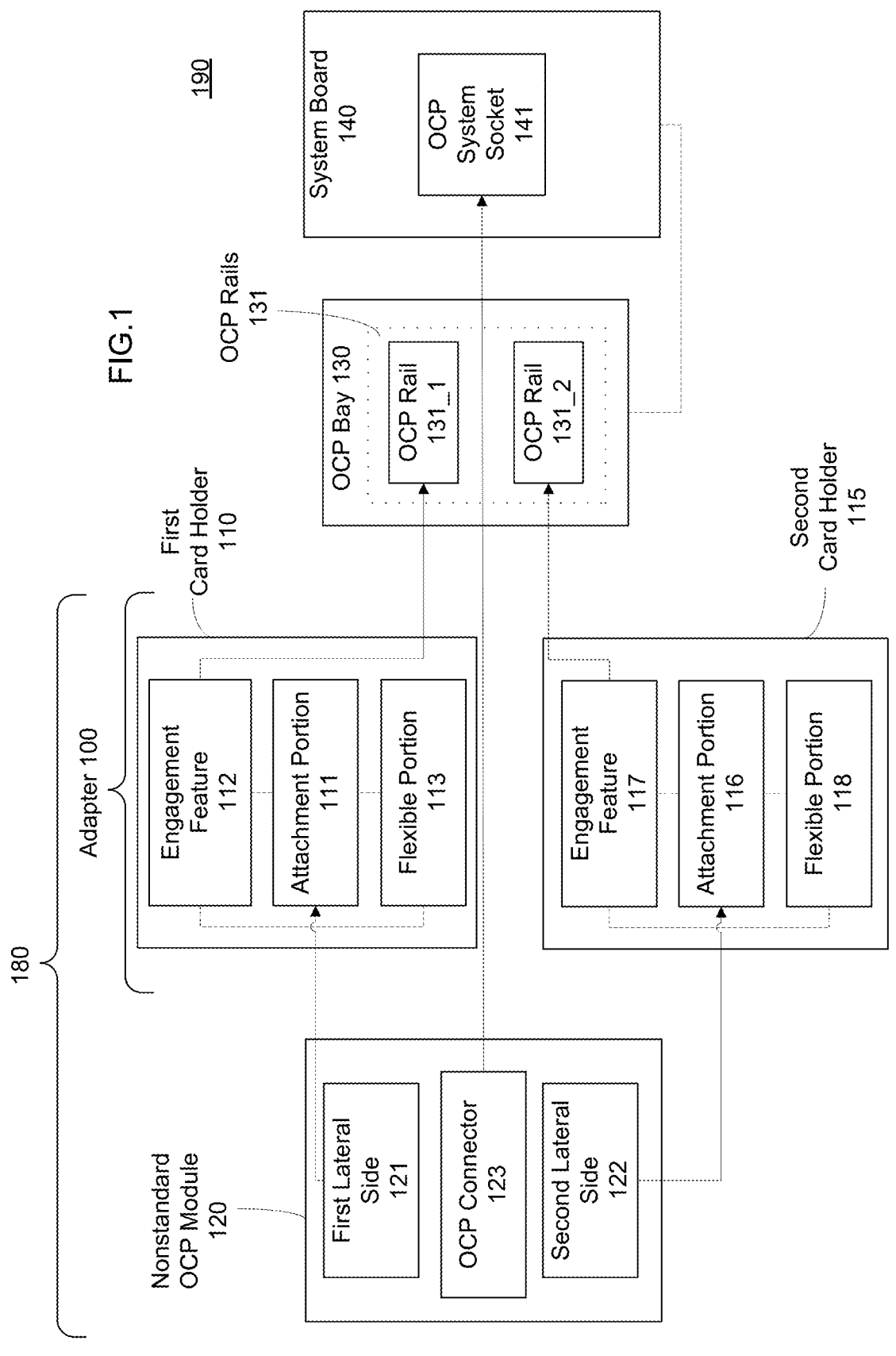
FIG. 1 is a block diagram illustrating an example of an assembly including an OCP adapter and a nonstandard OCP module, together with an example information processing device comprising OCP rails and an system board.

The drawings are included to provide a further understanding of the present disclosure and are incorporated in and constitute a part of this specification. The drawings illustrate one or more examples of the present teachings and together with the description explain certain principles and operations. In some occasions, details that are not necessary for an understanding of an instance of this disclosure or that render other details difficult to perceive may have been omitted.

DETAILED DESCRIPTION

Information processing devices which have an OCP HPM generally comprise OCP bays designed to receive standard OCP modules, which adhere to the dimensions of the OCP form factor. However, under some circumstances, it may be desired to use a module which does not comply with all of the OCP dimensional specifications ("a nonstandard module"). A nonstandard module might, for example, have an OCP connector which is capable of connecting to the OCP connector of the HPM in the OCP bay, but may have a non-standard height which exceeds the maximum height specified by OCP for a standard OCP module. Because the opening of the OCP bay in the rear panel has a height which matches that specified for standard OCP modules, the non-standard module might not fit through the opening due to the height of the nonstandard module exceeding the OCP standard height. Accordingly, it might not be possible to install such a nonstandard module through the OCP bay opening in the rear panel of the chassis.

One alternative would be to create a new chassis with an enlarged opening at the rear OCP bay to accommodate the nonstandard OCP module. However, this new chassis may not be suitable for use with standard OCP modules (e.g., because the larger opening might not properly engage with the faceplate of a standard OCP module). Accordingly, multiple chassis may have to be designed, with some systems being specialized for standard OCP modules and others specialized for various nonstandard modules. Such proliferation of chassis designs may increase development, manufacturing, and logistical costs.

Another alternative approach may be to continue to use the standard OCP bay for the nonstandard module, but rather than inserting the nonstandard module through the opening in the rear panel, remove a cover of the chassis and insert the nonstandard module into the bay from above through the removed cover. However, this approach generally does not work because a module inserted from above in this manner will not be able to engage with the OCP module guides (rails) in the OCP bay. OCP module guides (rails) are generally configured as a pair of parallel rails, with each rail having a groove which faces the other rail and which extends along an insertion direction of the OCP module. The opposite lateral edges of the PCB of the OCP module slide into the grooves as the OCP module is inserted into the OCP bay along the insertion direction. Accordingly, if a module is introduced to the bay from above, the edges of the PCB of the module cannot engage with the grooves because the grooves face laterally, and the top of the rails block the PCB from entering the grooves.

In addition, it is generally not possible to properly install a module in the OCP bay without engaging with OCP module guides (rails). The OCP module guide not only guides the module as to be properly inserted into the OCP bay, but it also provides structural support for the module while connected. Without proper engagement with the OCP module guide, movement of the system, shock, and/or vibration could either cause the module to disconnect from the OCP connector in the bay or cause substantial damage to the edge connector of the OCP module or the OCP connector of the OCP bay. Thus, presently, it is generally not feasible to properly install a nonstandard OCP module in a standard OCP bay by insertion from above through the cover (due to failure to engage with the OCP module guides) or by insertion through the rear panel (due to interference with the aperture).

To address the above-mentioned challenges, the disclosure provides an OCP adapter that attaches to a nonstandard module and allows the module to be installed in a standard rear OCP bay by insertion from above, instead of through the aperture in the rear panel of the chassis, while also allowing the module to engage with and be secured by the OCP module guides despite having been inserted from above. The adapter comprises two engagement features which are extend outwardly from opposite lateral sides of the module and are configured to engage with (i.e., fit within) the grooves of the two opposing OCP module guides. Moreover, the engagement features are movable laterally by elastic deformation of a portion of the adapter, and this ability to move the engagement features laterally can facilitate the insertion of the module from above. Specifically, the engagement features can be moved laterally inward (away from the OCP module guides), thus providing clearance to allow the nonstandard module with the adapter attached thereto to move downward past the tops of the OCP module guides into the space therebetween, and then once the engagement features become aligned with the grooves, they can be moved laterally outward (towards the OCP module guides) into the grooves. Once the engagement features are inserted into the grooves, the OCP module guides support the engagement features, which in turn supports the nonstandard module. Thus, the adapter allows for insertion of the nonstandard module from above while also allowing for engagement with, and support by, the OCP module guides.

In some examples, the adapter comprises two card holders which are attached to opposite sides of the nonstandard module, with each card holder comprising one of the above-mentioned engagement features. Each card holder may also include a tab which is attached to the engagement feature and which is arranged to be manually manipulated by a user, with the manipulation of the tabs causing the above-described lateral movement of the engagement features. For example, in some implementations squeezing the two tabs towards one another may cause the respective engagement features of the two card holders to move laterally inward (towards one another and away from the OCP module guides), while releasing the two tabs may allow the engagement features to move laterally outward (away from each other and towards the OCP module guides). In some examples, a spring feature may be connected to the engagement features to bias them towards the laterally outward positions. For example, the spring feature may comprise an elastically deformable arm which attaches the engagement feature and the tab to an attachment portion of the card holder, which is attached to the nonstandard module.

In some examples, during installation of the module into an OCP bay, a user may first press the tabs towards one another (e.g., against the nonstandard module). This moves the engagement features away from the OCP module guides and thus allows for the adapter and nonstandard module to be moved downward past top of the OCP module guide into the space between the OCP module guides (rails). Once placed on in the space between the OCP module guide, the tabs adapters are released and the spring feature causes the engagement features to move laterally outward and into the grooves of the OCP module guide. Once the engagement feature have entered the grooves in the guide, the adapters, and the module which they are attached to, are then simply slid along the grooves towards the OCP connector of the bay until the OCP connector of the module makes a connection with the OCP connector of the bay. The above steps in reverse order are performed to remove the nonstandard module from the OCP bay.

These and other examples will be described in greater detail below in relation to FIGS. 1-9.

Now referring to FIG. 1, an adapter 100 for a nonstandard OCP module 120 is presented. The adapter 100 is illustrated in association with an information processing device 190 comprising an OCP bay 130 and a system board 140 for context. FIG. 1 also illustrates adapter 100 with a first card holder 110 and a second card holder 115 as an example. In instances, the adapter 100 may only include the first card holder 110. In some instances, the adapter 100 may include the first and second card holders 110/115. In instances, the adapter 100 may further include a third card holder. In some instances, the adapter may include a fourth card holder. It is apparent, in light of this disclosure, to one or ordinary skill in the art that the configuration of card holders is not limited to the examples provided. FIG. 1 also illustrates a module/adapter assembly 180 that includes the adapter 100 and the nonstandard OCP module 120. Although the adapter 100, assembly 180, and information processing device 190 (comprising OCP bay 130 and system board 140) are described together herein for ease of understanding, it should be understood that the adapter 100, assembly 180, and information processing device 190 may be produced or sold separately or together and may be claimed separately or together herein.

In instances, first card holder 110 includes an attachment portion 111 and an engagement feature 112. The attachment portion 111 is configured to attach to the nonstandard OCP module 120, for example via a fastener, interlocking engagement, adhesive, solder, or any other fastening technique. The engagement feature 112 is connected (directly or indirectly) to the attachment portion 111 and configured to engage with a groove in an OCP rail 131, as will be described in greater detail below. In instances, engagement feature 112 movable between an extended position and a retracted position. In the extended position, the engagement feature 112 protrudes laterally from the attachment portion 111 farther than in the retracted position. More specifically, in some examples, when the card holder 110 is attached to the nonstandard OCP module 120, the engagement feature 112 protrudes laterally beyond a lateral edge of the first lateral side of the nonstandard OCP module 120 when in the extended position, and does not protrude beyond (or protrudes a shorter distance beyond) the lateral edge when in the retracted position.

In some instances, first card holder 110 includes a flexible portion 113 which facilitates motion of the engagement feature 113 relative to the attachment portion 111. In some instances, flexible portion 113 may be coupled with, or a part of, attachment portion 111 and/or engagement feature 112. For example, in a retracted position of the engagement feature 113, flexible portion 113 may deform as to allow engagement feature 112 to be moved towards the attachment portion 111. While in an extended position of the engagement feature 113, flexible portion 113 stays in its undeformed form.

In some instances, flexible portion 113 may couple engagement feature 112 to attachment portion 111. In some instances, attachment portion 111, engagement feature 112 and flexible portion 113 may be a monolithic structure. For example, attachment portion 111, engagement feature 112 and flexible portion 113 may be a single structure made of the same material, such as plastic. In some instances, attachment portion 111 and engagement feature 112 may be made of a different material than flexible portion 113. The flexible portion 113 is flexible along at least one degree of freedom of motion (DOF), which means that the flexible portion can readily deform (e.g., bend) along that DOF without breaking. (In this context, "readily deform" means a relatively low force, such as 20 N or less, applied to the engagement feature 112 can cause the deformation of the flexible portion 113 along the DOF). The DOF along which the flexible portion 113 is flexible is one which allows for movement of the engagement feature 112 between the extended and retracted positions, and may be referred to herein as the flexible DOF. In some examples, the flexible portion 113 is not only flexible but is also elastically flexible along the flexible DOF, meaning that, in response to an being deformed by an external applied force, the flexible portion 113 generates a restoring (spring) force which returns the flexible portion 113 to its original non-deformed form once the applied force is removed. In some examples, the flexible portion 113 may be rigid (less flexible) along at least one other DOF (rigid DOF), meaning that the flexible portion 113 does not readily deform along the rigid DOF. Being rigid along one DOF allows the flexible portion 113 to, in some examples, provide structural support for the engagement feature 112. For example, in those implementations in which the flexible portion 113 connects the engagement feature 112 to the attachment feature 111, the flexible DOF may be one which allows for horizontal motion of the engagement feature 112 relative to the attachment feature 111 while the rigid DOF may be one which resist or prevents vertical motion of the engagement feature 112 relative to the attachment feature 111. In other words, in some examples, the flexible portion 113 may vertically support the engagement feature 112 while also allowing horizontal motion thereof. In some examples, the ability of the flexible portion 113 to be flexible along the flexible DOF and rigid along the rigid DOF may be due to the shape of the flexible portion 113, i.e., the shape may favor deformation along one DOF while disfavoring deformation along another DOF. In some examples, some other structure (such as the board of the OCP module) may vertically support the flexible portion 113 in a manner which causes or contributes to the rigidity of the flexible portion 113 along the rigid DOF. In some examples, the rigidity of the flexible portion 113 along the rigid DOF may be due to a combination of the shape of the flexible portion 113 and support provided by some other structure.

In instances where adapter 100 includes the second card holder 115, second card holder 115 includes attachments portion 116 and engagement feature 117. The attachment portion 116 is configured to attach to the nonstandard OCP module 120. The engagement feature 117 is coupled to the attachment portion 111 and configured to engage with a groove of an OCP rail, such as OCP rail 131_2. In some examples, the engagement feature 117 is movable between extended and retracted positions. In other examples, the engagement feature 117 is stationary relative to the attachment portion 116. In some instances, second card holder 115 may include a flexible portion 118 to facilitate motion of the engagement feature 117. In such cases, the flexible portion 118 may be flexible along at least one DOF, as described above in relation to flexible portion 113. The flexible portion 118 may also be, in some examples, rigid along another DOF, as described above in relation to flexible portion 113.

Second card holder 115 may be the same as first card holder 110, in some examples. In other instances, second card holder 115 may differ from first card holder 110 in one or more ways. For example, the second card holder 115 (or parts thereof) may be made of different materials than the first card holder 110 (or corresponding parts thereof). In an example, second card holder 115 may be made of different materials, such as flexible portion 118 being a flexible plastic while attachment portion and engagement feature 117 being of a rigid plastic, while first card holder 110 may be a monolithic structure, such as the entire first card holder 110 being made of a semi-flexible plastic. As another example, in some implementations first card holder 110 may include a flexible portion 113 while second card holder 115 omits a flexible portion.

In some instances, adapter 100 may include more card holders such as a third and fourth card holders (not illustrated). In some examples, each card holder may include an attachment portion and an engagement feature, which may be configured similarly to the attachment portion 111 and engagement feature 112 described above (although they need not be identical). In some of these examples, all of the card holders are the same as one another (e.g., the same as the first card holder 110). In other examples, one, some, or all of the card holders differ from one another. In other words, further included card holders may be the same as, or differ from, the first and/or second card holders 110/115.

In instances, nonstandard OCP module 120 includes a first lateral side 121, a second lateral side 122 and an OCP connector 123. The OCP connector 123 is a standard OCP edge connector (e.g., an OCP 4C or 4C+ edge connector) formed at a front edge of a PCB of the OCP module 120. The first lateral side 121 and second lateral side 122 may be opposite lateral sides of the PCB of the OCP module 120, which include the two lateral edges of the PCB and adjoining regions. The lateral edges are the edges of the PCB which extend parallel to the OCP rails 131 when the OCP module 120 is installed in the OCP bay 130, or in other words, the edges of the PCB which extend perpendicularly from the front edge of the PCB which forms the OCP connector 123. The attachment portion 111 attaches to the first lateral side 121. In configurations where adapter includes the second card holder 115, the attachment portion 116 attaches to the second lateral side 122. In implementations in which additional card holders are included, these may attach to either the first lateral side 121 or the second lateral side 122 as well (e.g., in one example, two card holders are attached to the first lateral side 121 and two card holders are attached to the second lateral side 122). In instances, OCP bay 130 includes OCP rails 131 (shown in dotted lines). For ease of description, OCP rails 131 is shown with a first OCP rail 131_1 and second OCP rail 131_2. More specifically, OCP bay 130 comprises a volume within a chassis (not illustrated) of the information processing device 190 which is configured to receive a standard OCP module, together with associated structures (such as the OCP rails 131) which define that volume and which support or otherwise facilitate installation of the OCP module in the volume. The rails 131_1 and 131_2 may be arranged parallel to one another and the aforementioned volume may include the space between the two rails 131_1 and 131_2. In this sense, the rails 131, in part, define the OCP bay 130. The rails 131 may be attached, directly or indirectly, to the chassis. The rails 131 comprise grooves configured to engage with edges of a standard OCP module inserted into the bay 130, guide the OCP module into an installation position in which it is mated with the OCP system socket 141 (described below), and support the OCP module in this installed state.

The nonstandard OCP module 120 may be nonstandard in that it has one or more dimensions which do not comply with those specified by OCP and/or which do not allow for installation in the OCP bay 130 (without aid of the adapter 100). For example, in some implementations, OCP bay 130 has an opening (e.g., in a rear panel) through which standard OCP modules are inserted into the bay 130, but the nonstandard OCP module 120 may have a height dimension which exceeds the height of the opening (this may also exceed a height specified by OCP, in some cases). As another example, in some implementations, the OCP rails 131 are separated by a given distance, but the nonstandard OCP module 120 may have a width which is less than the given distance such that edges of the OCP module 120 cannot engage with both rails 131 (this width may also be less than a width specified by OCP, in some cases). Thus, OCP module 120 cannot be installed in the OCP bay 130 on its own. However, the adapter 100 can allow the non-standard OCP module 120 to be installed in the OCP bay 130. More specifically, the adapter 100 is mounted to the nonstandard OCP module 120 to form assembly 180 and then the assembly 180 is installed in the bay 130. When the assembly 180 is installed in the OCP bay 130, engagement feature 112 of first card holder 110 engages with the first OCP rail 131_1. In configurations where the second card holder 115 is used, when the assembly 180 is installed in the OCP bay 130 the engagement feature 117 of the second card holder 115 engages with the second OCP rail 131_2. The process by which this engagement is achieved is described below. It should be understood that this arrangement is described in this manner for the purpose of ease of description, as such, first and second card holder 110/115 can interchangeably engage with either of the OCP rails 131.

The information processing device 190 also includes the system board 140, which is attached to and supported by the aforementioned chassis. A "system board," as used in this disclosure, is a central circuit board comprising a central processing unit (CPU) and supporting circuitry, and configured to enable connection and integration among a plurality of components and devices. In examples, system board 140 may include an OCP primary board. In an instance, "OCP primary board," is a primary board configured for OCP form factor. In some instances, a primary board which complies with OCP form factors may be referred to as a Host Processor Module (HPM). In instances, system board 140 includes an OCP system socket 141, which is positioned in or adjacent to the OCP bay 130. As used herein, an "OCP system socket" is a standardized socket configured to connect to OCP compliant components. For example, OCP system socket 141 may be OCP 4C+ socket configured to receive a standard form factor (SFF) OCP module. In some instances, OCP system socket 141 may include multiple OCP sockets. For example, OCP system socket 141 may include a primary 4C+ and a secondary 4C sockets used for receiving a long form factor (LFF) OCP module. In a state of assembly 180 engaged with OCP bay 130 and connected to system board 140, OCP connector 123 connects to OCP system socket 141. It should be noted that OCP system socket 141 may include other OCP form factor sockets not discussed herein, such as a socket for a short for factor (SFF) OCP module.

The installation and removal of the assembly 180 into and out of the OCP bay 130 will now be described, with primary focus being on an example in which the adapter 100 includes first and second card holders 110 and 115 for ease of understanding. But it should be understood that the same principles apply to examples which include additional card holders. The assembly 180 is installable in the OCP bay 130 by, among other things, selectively changing the adapter 100 between a first state and a second state. The adapter 100 is changed between the first and second states by moving the engagement features 112 and/or 117 of the card holders 110 and/or 115.

When adapter 100 is in a first state, engagement feature 112 of first card holder 110 is in the retracted position and assembly 180 is movable vertically into or out of a space between OCP rails 131. In a configuration where a second adapter 100 is used, in the first state, engagement feature 117 of second card holder 115 may also be in a retracted position. Because the engagement feature 112 and/or 117 is in the retracted position, when narrow enough to allow for vertical insertion into the space between the rails 131 the assembly 180 is narrow enough in a lateral dimension to fit between the rails 131, thus allowing for vertical insertion of the assembly 180 into the space between the rails.

In some instances, when adapter 100 is in the first state, the widest lateral extent of the assembly 180 may be less than a separation distance between the OCP rails 131. For example, in instances in which both first and second card holders 110 and 115 are present, when the adapter 100 is in the first state, the distance between the respective outer edges of the engagement features 112/117 of the first and second card holders 110/115 is less than a separation distance between the OCP rails 131. In such examples, because the widest lateral extent of the assembly 180 is less than the separation distance between the rails 131, there is no interference between the rails 131 and the assembly 180 which would prevent the assembly 180 from being moved vertically into or out of the space between the OCP rails 131.

In other instances, when adapter 100 is in the first state, the widest lateral extent of the assembly 180 may be equal to or slightly larger than a separation distance between the OCP rails 131, but still sufficiently narrow as to allow for insertion between the rails 131. For example, in such instances, insertion between the OCP rails 131 may be achieved by tilting the assembly 180, inserting one side of the assembly (e.g., engagement features 117) into the groove of one rail 131, and then lowering the other side of the assembly 180 (e.g., engagement features 112) past the other rail 131. In this case, the inserting of one side of the assembly 180 into the groove allows the assembly 180 to move laterally just far enough to create clearance between the other rail 131 and the other side of the assembly 180.

The adapter 100 may be placed in the first state by moving the engagement feature 112 (and also, in some cases, engagement feature 117) to the retracted position. For example, a user may manually move the engagement features 112 and/or 117 to the retracted position by squeezing them laterally towards one another.

When adapter 100 is in a second state, engagement feature 112 of first card holder 110 is in the extended position and engaged with a groove of OCP rail 131_1 to secure assembly 180 to OCP rail 131_1. In configurations where a second OCP adapter 100 is used, in the second state, engagement feature 117 of second card holder 115 is also in an extended position and engaged with a groove of OCP rail 131_2 to secure assembly 180 to OCP rail 131_2. In configurations where the second OCP adapter 100 is not present, in the second state an edge of the nonstandard OCP module 120 may be engaged with the groove of OCP rail 131_2. In instances, where adapter 100 is in the second state, the widest lateral extent of the assembly 100 may be greater than the separation distance between the OCP rails 131 such that lateral edges of the assembly 180 can be received in the grooves of both of the OCP rails 131. More specifically, in instances, where both first and second card holders 110 and 115 are present, when the adapter 100 is in the second state, the distance between the respective outer edges of the engagement features 112/117 of the first and second card holders 110/115 is greater than the separation distance between OCP rails 131 such that the engagement features 112 and 117 extend into the grooves of the rails 131_1 and 131_2, respectively. In instances where the first card holders 110 is present but second card holder 115 is omitted, when the adapter 100 is in the second state, the distance between the outer edges of the engagement feature 112 and an opposite edge of the nonstandard OCP module 120 is greater than the separation distance between OCP rails 131 such that the engagement features 112 extends into the groove of the rail 131_1 and the opposite edge of the nonstandard OCP module 120 extends into the groove of rail 131_2.

The adapter 100 may be placed in the second state by moving the engagement features 112 and/or 117 to the extended position while the assembly 180 is positioned between the rails 131. For example, in some cases, the extended position may be a resting or default position of the engagement features 112 and/or 117, and the flexible portions 113 and/or 118 may generate elastic (e.g., spring) forces which automatically urge the engagement features 112 and/or 117 to move back toward the extended position when a user releases the engagement features 112 and/or 117. In other examples, the user may manually move the engagement features 112 and/or 117 back to the extended position.

In instances where assembly 180 is in an installed state, engagement feature 112 of first card holder 110 is in the extended position and engaged with a groove of OCP rail 131_1 to secure assembly 180 to OCP rail 131_1, while OCP connector 123 of the nonstandard OCP module 120 is communicatively connected to the OCP system socket 141 of the system board 140. In configurations where a second OCP adapter 100 is used, engagement feature 117 of second card holder 115 is also in an extended position and engaged with a groove of OCP rail 131_2 to secure assembly 180 to OCP rail 131_2. In some instances, engagement feature 112 and/or engagement feature 117 are locked to the OCP rails 131 when in the installed state. In other words, the installed state of the assembly 180 is similar to the second state with the addition of the OCP connector 123 being connected to the OCP system socket 141. The installed state may be achieved by, after entering the second state and engaging the assembly 180 with the rails 130, sliding the assembly 180 along the rails 130 until the OCP connector 123 connects with the OCP system socket 141.

Thus, to summarize the above, an installation process of the assembly 180 into the OCP bay 130 may proceed as follows: a user positions the assembly 180 in a space vertically above the rails 131; next, the user places the adapter 100 in the first state (e.g., moving the engagement features 112 and/or 117 to the retracted positions); next, with the adapter 100 still in the first state, the user moves the assembly 180 vertically downward into the space between the rails 131; next, the user places the adapter 100 in the second state (e.g., moving the engagement features 112 and/or 117 to the extended positions), which engages the assembly 180 with the grooves of the rails 131; and finally, the user slides the assembly 180 along the rails 131 until the OCP connector 123 connects with the OCP system socket 141. A removal process of removing an installed assembly 180 from the OCP bay 130 may proceed by reversing the aforementioned actions. Thus, the adapter 100 can allow for the nonstandard OCP module 120 to be installed in the OCP bay 130 which is designed to receive a standard OCP module notwithstanding the nonstandard OCP module 120 having one or more nonstandard dimensions. In particular, because the nonstandard OCP module 120 can be installed by moving vertically into the bay 130, the inability of the nonstandard OCP module 120 to fit through an opening of the bay 130 in the rear panel does not prevent its installation.

Figure 2:
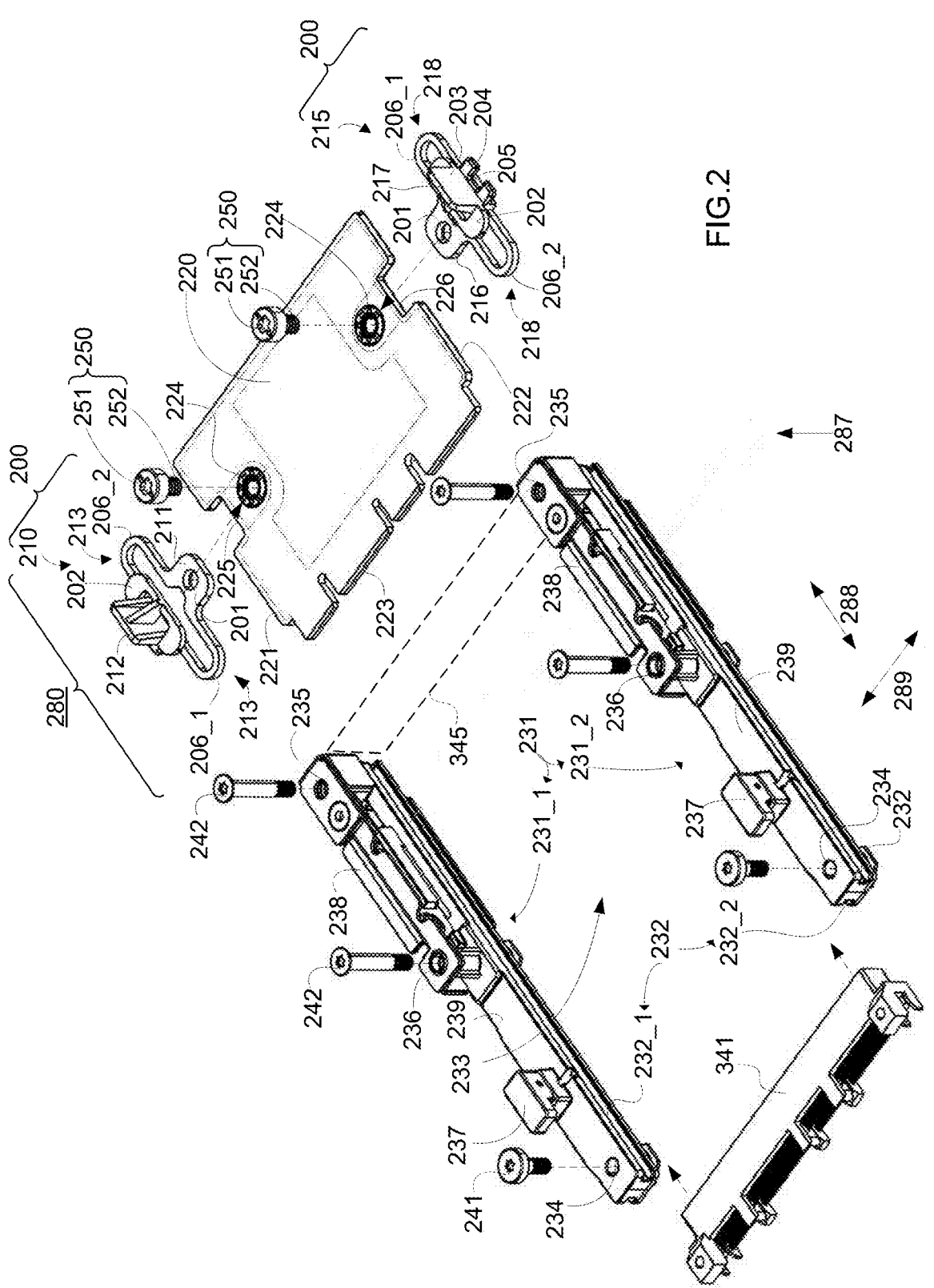
FIG. 2 is an exploded view of an example assembly of an OCP adapter and a nonstandard OCP module, and an example OCP bay comprising OCP rails and an OCP system socket.

Now referring to FIGS. 2-7, an example OCP adapter 200 will be described. The OCP adapter 200 is illustrated in association with an example nonstandard OCP module 220 and example OCP rails 231 for context. FIGS. 2-7 illustrates an example OCP adapter 200. FIGS. 2-6 illustrates assembly 280 including OCP adapter 200, and example nonstandard OCP module 220. FIGS. 2-4 illustrates example assembly 280 and example OCP rails 231. The OCP adapter 200, the assembly 280 and OCP rails 231 are described simultaneously below for ease of understanding. However, it should be understood that the OCP adapter 200, the assembly 280 and the OCP rails 231 may be produced or sold separately or together and may be claimed separately or together herein. The OCP adapter 200 is an example implementation of adapter 100. Assembly 280 is an example implementation of assembly 180. Example OCP rails 231 are an example of OCP rails 131, where rail 231_1 and 231_2 are examples of OCP rail 131_1 and rail 131_2. Elements in FIGS. 2-7 and elements in FIG. 1 whose reference numbers have the same last two digits as one another, such as 110 and 210, correspond to one another, with the element in FIGS. 2-7 being one implementation example of the corresponding element in FIG. 1—for example, first card holder 210, second card holder 215, nonstandard OCP module 220 and so on, correspond, respectively, to first card holder 110, second card holder 115, nonstandard OCP module 120 and so on.

Example OCP rails 231, as described above, includes OCP rail 231_1 and 231_2. Each of the OCP rails 231 includes a front portion 239 comprising a bay/chassis wall fastening aperture 234, and a rear portion 238 comprising bay/chassis wall fastening apertures 235 and 236. The bay/chassis wall fastening aperture 234, 235, and 236, as described herein, are apertures for receiving a fastener, such as a screw 241 or 242, that allows OCP rails 231 to be secured to a system chassis or other supporting structure which is in turn coupled to the chassis. For example, the rails 231 may be disposed on a basepan of the chassis adjacent to a rear panel of the chassis, and screws 241 and 242 may extend through fastening apertures 234, 235, and 236 and engage with basepan to secure rails 231 thereto. In addition, the rails 231 may be attached to other support structures. For example, an internal horizontal bay divider wall (not illustrated in FIGS. 2-7, but see horizontal bay divider wall 934 in FIG. 9) may rest upon rear portion 238 of the rails 231 and may be attached thereto by screws 242 which extend through the divider wall and through the fastening apertures 235 and 236. It is noted that the OCP bay of which the OCP rails 231 are a part of is omitted for illustrative purposes, but this bay includes the rails 231 and the space 233 between the rails 231. Moreover, there is an opening 345 at the rear ends of the rails 231 through which standard OCP modules are to be inserted into the space 233. The opening 345 may coincide with an aperture in the rear panel of the chassis, although this aperture may in some cases be covered by a perforated panel to provide EMI shielding when a standard OCP module is not installed in the bay. The bay is defined in part by the rails 231 which define lateral bounds of the bay, in part by the basepan which defines a lower bound of the bay, in part by the connector 341 which defines a front bound of the bay, and by opening 345 which defines a rear bound of the bay. In some cases, a top bound of the bay may be defined by a height of the opening 345 and/or by other structures, such as internal divider walls of the chassis, which may divide the bay from another bay positioned vertically above the bay. Depending on the configuration of a chassis/OCP bay that OCP rails 231 are installed on, one or more of wall fastening apertures 234, 235, and 236 may be used. In some other configurations, wall fastening apertures 235 and 236 may attach to one OCP bay wall, while wall aperture 234 may attach to another wall. As OCP rails 231 are described through one example, it should be noted that other types of OCP rails may be used in lieu of the OCP rails 231 which may or may not include one or more of apertures 234, 235, and 236. Indeed, any pair of OCP rails designed to receive a standard OCP module and which have grooves to engage the module may be used in lieu of the OCP rails 231.

Example OCP rails 231 include at least one groove 232 on a lateral side thereof which faces into the space 233 between the rails 231. Each groove 232 is recessed in a lateral direction 289 from the lateral face of the rail 231 and extends along a longitudinal direction 288, of OCP rail 231_1 and 231_2. Grooves 232 receives a side of an standard OCP module or engagement features 212 or 217 of the assembly 280, described below. In the illustrated example, each lateral side of the rails 231 includes a groove 232. This may beneficially allow for a single OCP rail design to be used for both OCP rails of a pair, rather than having to produce different rails for different sides of the pair. In addition, having grooves 232 in both sides of the rails 231 can allow one OCP rail 231 to be used as part of two adjacent OCP bays, with the groove 232 on one side of the OCP rail 231 engaging a module in one bay and the groove 232 on the other side thereof engaging a module in an adjacent bay. In other examples, OCP rails with only a single groove in one side thereof may be used. In the examples presented, grooves 232 are described as groove 232_1 and groove 232_2 for ease of understanding. As such, groove 232_1 is described as part of rail 231_1 for the purpose of describing the interactions of assembly 280 with OCP rails 231 as an example without limitations. In this example, groove 232_1 receives engagement feature 212 and groove 232_2 receives engagement feature 217. It should be noted that there are two OCP rails 231 illustrated in FIGS. 2-7 and these rails 231 are also labelled 231_1 and 231_2 when referring to a specific one of the rails 231, for ease of description. In the examples, rails 231_1 and 231_2 include grooves 232 on both sides. For example, number of OCP rails 231 may be limited by the size of their respective OCP bay (not shown). In other examples, another third OCP rail 231 could be included, where a second adapter/module assembly could be installed in rails 231 and third rail. In other examples, assembly 280 may be installed in rails 231_1 and 231_2, while an OCP module may be installed in OCP rail 231_2 and a third OCP rail. A person of ordinary skill would understand that multiple OCP rails may be included, and the example is provided with only one assembly 280 and two OCP rails 231 for illustration and ease of understanding purposes.

Referring to the exploded view of FIG. 2, OCP rails 231 includes one or more module locks 237. As used herein, a module lock 237 is a component used to keep an OCP module in place while connected. The module lock may engage with a standard OCP module inserted into the bay or with the assembly 280 comprising a nonstandard OCP module 220, as will be described in greater detail below. In this example, module lock 237 stays coupled to attachment portion 212/217 in an extended position while assembly 280 is in an installed position. It should be noted that uninstalled and installed positions are used herein to describe assembly 280 in reference to being connected or not connected to an OCP system socket 341 while one or both adapters 200 are in the second state, as shown in reference to FIGS. 3C and 3D. Being connected or not connected refers to the OCP connector 223 being communicably connected to a system board through the OCP system socket 341.

Figure 3A:
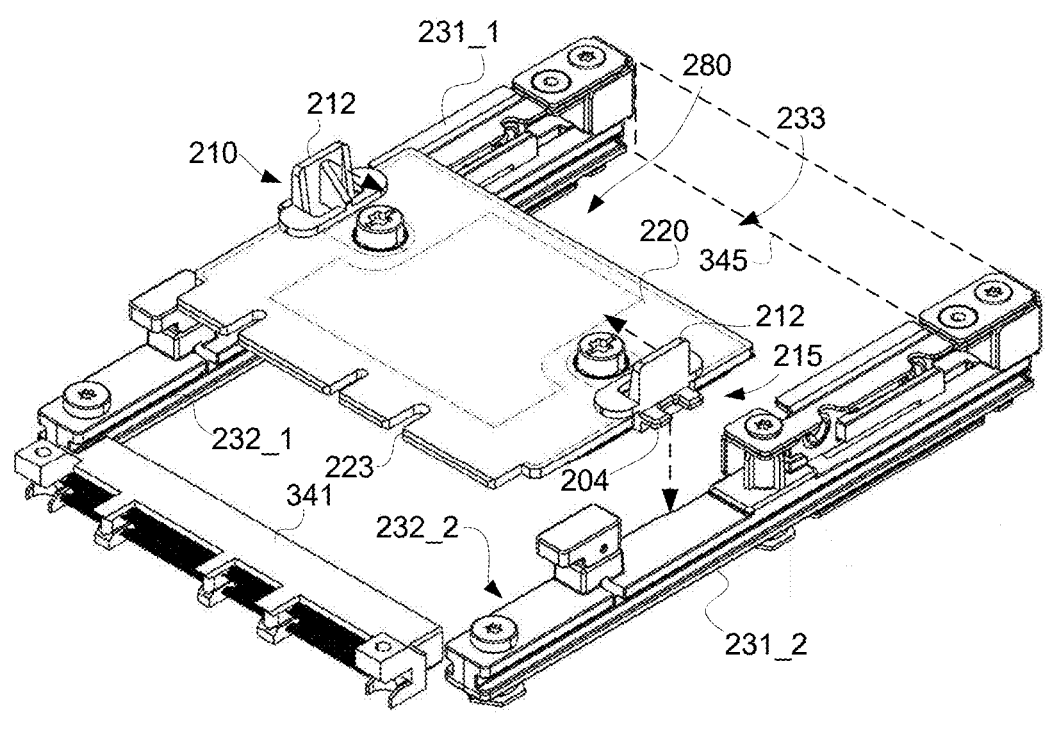
FIG. 3A is a top front perspective view of the assembly and OCP bay of FIG. 2 in a first stage of an installation process of the assembly into the OCP bay.
Figure 3B:
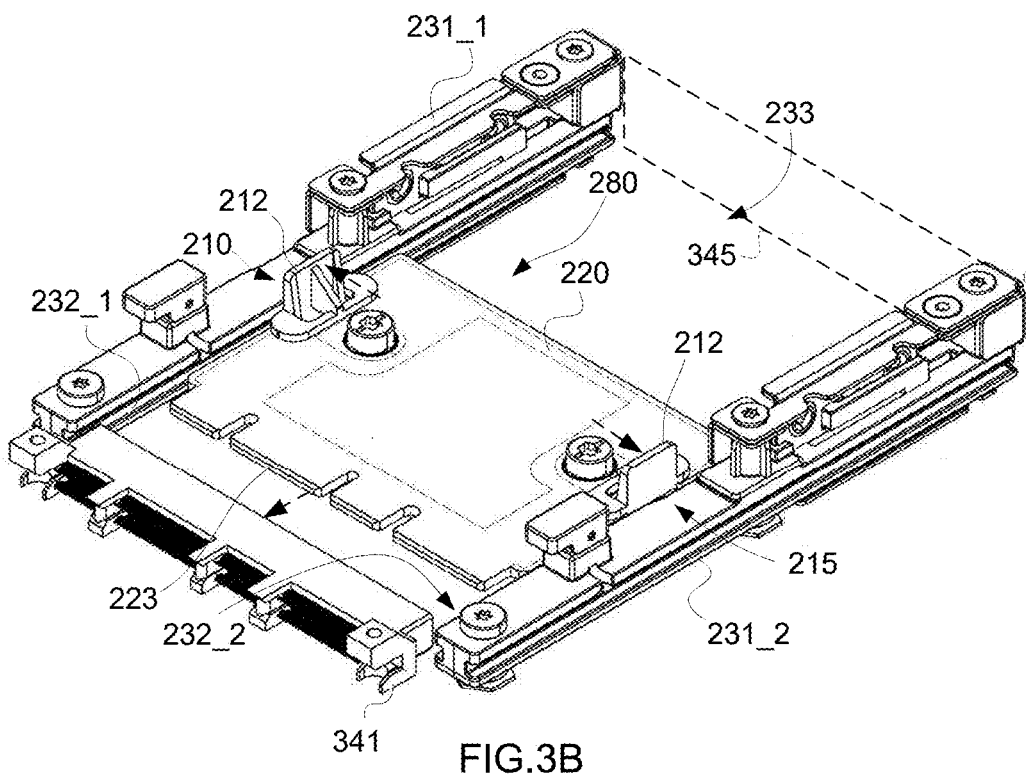
FIG. 3B is a top front perspective view of the assembly and OCP bay of FIG. 2 in a second stage of the installation process.
Figure 3C:
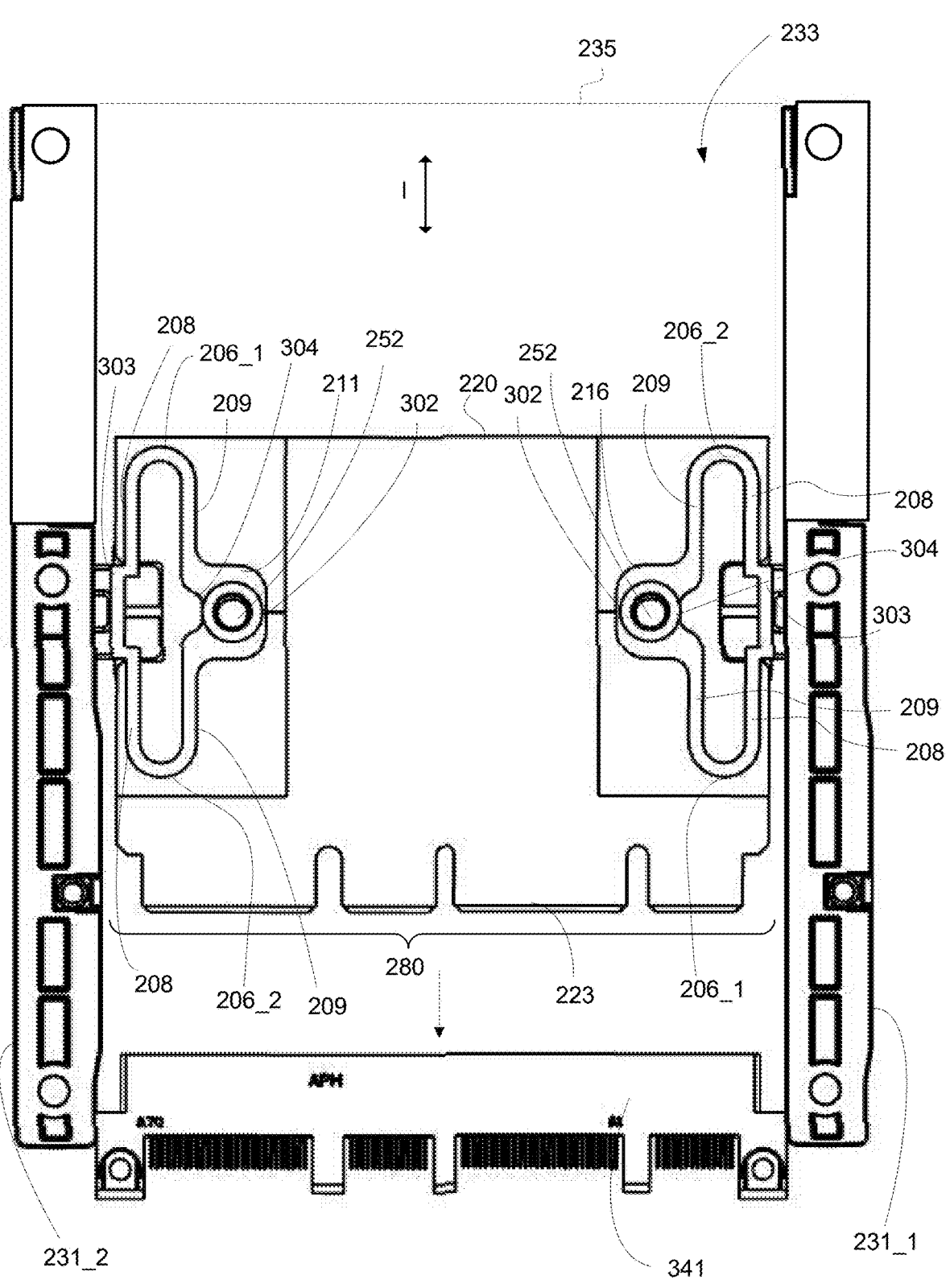
FIG. 3C is a bottom view of the assembly and OCP bay of FIG. 2 in the second stage of the installation process.
Figure 3D:
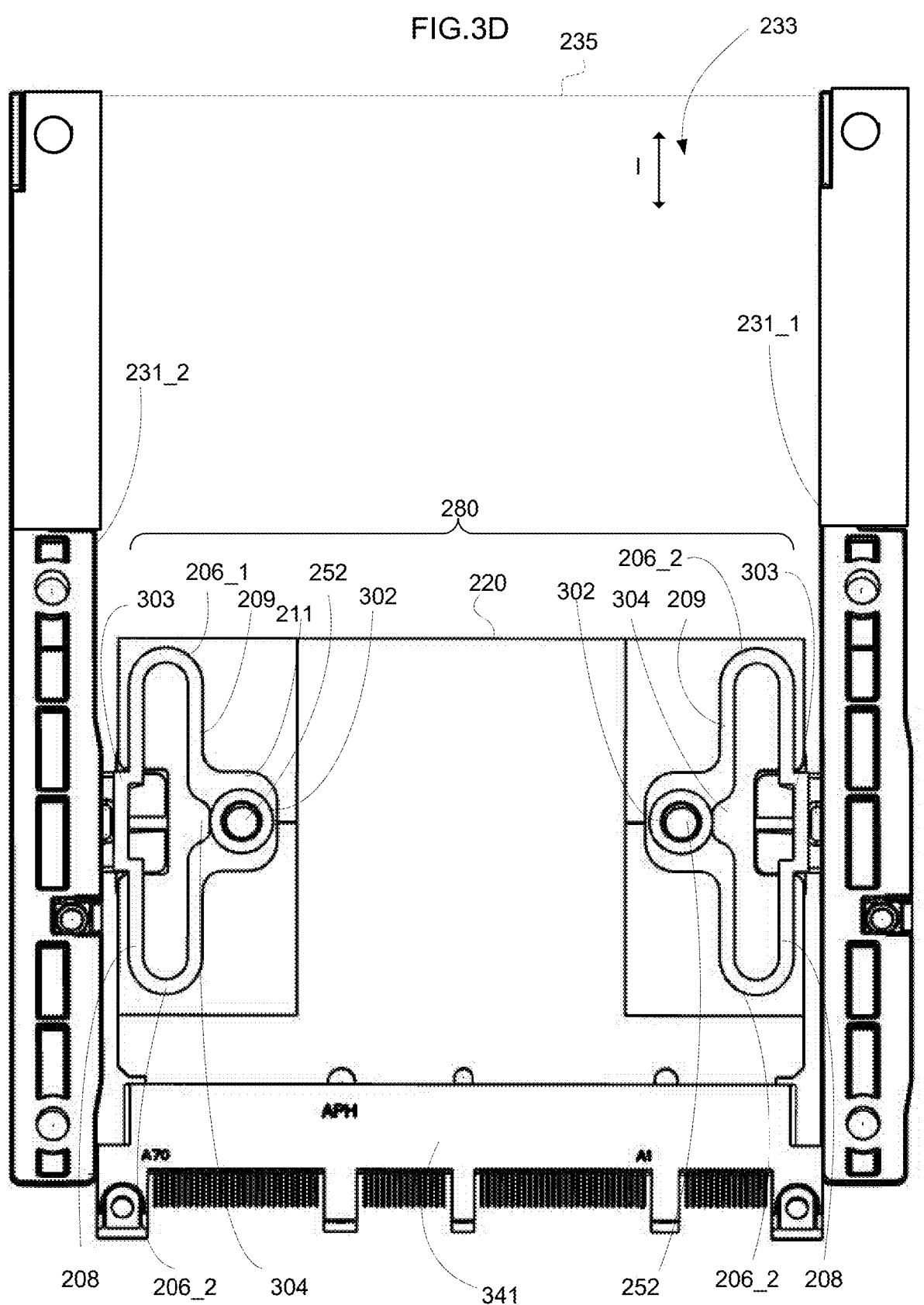
FIG. 3D is a bottom view of the assembly and OCP rails of FIG. 2 in a third stage of the installation process corresponding to an installed state.

As shown in FIGS. 2-3D, an OCP system socket 341 may be provided adjacent to a front end the rails 231, defining a front bound of an OCP bay (not shown). OCP system socket 341 may be attached to the chassis or to OCP rails 231. OCP system socket 341 is an example of OCP system socket 141. FIGS. 3A-3C illustrate the OCP module 220 in an uninstalled position, while FIG. 3D illustrates the OCP module 220 in an installed position. In these examples, module lock 237 locks the assembly 280 in place while OCP connector 223 is connected to OCP system socket 341. Module lock 237 is used in this example to provide stability to assembly 280 while connected and to prevent OCP connector 223 from disengaging from OCP system socket 341. In this example, module lock 237 includes a lever and fastener, where when the fastener is movable into/out of the groove 232 by actuation of the lever and, when fully inserted into the groove 232, it provides the locking capability. The module lock 237 is configured to be used with regular OCP boards, with the fastener engaging with a notch in the edge of the standard OCP module to secure the OCP module.

Similarly, the fastener engages a notch-like lock engagement 205 in the engagement feature 212/217 to secure the assembly 280. Generally, with a standard OCP module engaged with the module lock 237 the fastener would be required to be disengaged to remove the regular OCP module. However, the retracted position capability of the engagement feature 212/217 allows for the assembly 280 to be removed without manipulating the module lock 237. For example, to remove the assembly 280 from an installed position, the engagement feature 212/217 would only need to be moved to a retracted position and the assembly moved away from the OCP system socket 241.

Although the use of the module lock 237 provides stability benefits, it should be understood that in other examples OCP rails 231 may not include module lock 237, or may include a non-actuatable module lock such as a bump/detent permanently positioned with in the grooves of the rails. It should also be understood that although the example includes one module lock 237 in each rail 231, other examples may only include a module lock 237 in one of the OCP rails 231. In examples including more than two OCP rails 231, module locks 237 may be included on all the OCP rails 231, on only a portion of the OCP rails 231 or none of the OCP rails 231 may include module lock 237.

Continuing on the exploded view example of FIG. 2, the nonstandard OCP module 220 includes a PCB comprising a first lateral side 221, a second lateral side 222, an OCP connector 223, a first deformation zone 225 and a second deformation zone 226. The OCP connector 223 is an edge connector which has a form factor complying with an OCP standard, such as an OCP 4C or 4C+ edge connector. Each of the first and second lateral sides 221 and 222 comprises a fastener receiver 224 which is to facilitate attachment of the card holders 210 and 215 to the PCB of the nonstandard OCP module 220 by receiving a fastener 250. Fastener receiver 224 may comprise an aperture, which in some examples is threaded (e.g., a nut). In a configuration where only one card holder 210 is used, attachment portion 211 attaches to the first lateral side 221 of the nonstandard OCP module 220. In this example, two card holders 210 and 215 are used where attachment portion 211 of card holder 210 attaches to the first lateral side 221 while attachment portion 216 of card holder 215 attaches to the second lateral side 222.

Figure 4A:
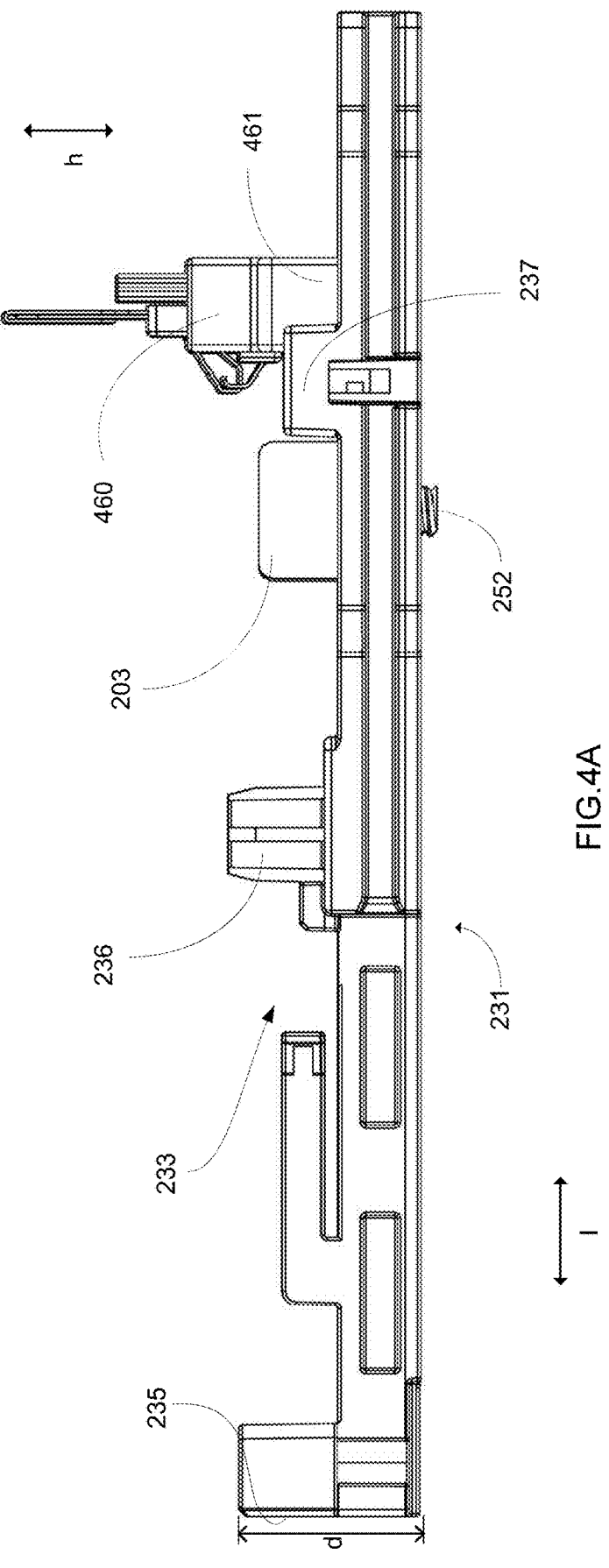
FIG. 4A is a side plan of the assembly and OCP bay of FIG. 2, with a module component connected to the nonstandard OCP module.

The OCP module 220 may include additional elements which are not visible in FIGS. 2-3D. For example, as shown in FIGS. 4A/B and 5A/B, the OCP module 220 may also include a module component 460 mounted or coupled to the PCB. In instances, module component 460 may be an integrated circuit component which is permanently mounted (e.g., soldered) to the PCB. In other instances, module component 460 may be a socketed integrated circuit component which is removably coupled to the PCB, for example via a connector mounted to the PCB. In instances, module component 460 may be a connector with an attached cable, for example to communicatively connect other components to the nonstandard OCP module 220. Examples of module component 460 may include GPU cards, RAM cards, hardware accelerators with integrated heat sink, expansion cards mounted parallel to the nonstandard OCP module 220, such as M2 cards, and the like. In examples, module component 460 may include PCIe connectors, I2C connectors, power source connectors, and the like. As used in these examples, a socketed integrated circuit component refers to removable components, such as computing chips, that are attached to nonstandard OCP module 220. In these examples, nonstandard OCP module 220 includes a component socket 461.

Component socket 461 may include a plurality of sockets, such as PCIe slots, OCP module socket (used for connecting other OCP modules), memory module sockets, microcontroller sockets, and the like. A person of ordinary skill in the art, upon reading this disclosure, will appreciate that adapter 200 enables the use of a nonstandard OCP module 220 with a module component 460, integrated or in conjunction with component socket 461, with a height which causes the overall height of the module 220 to exceed the height specified by OCP standards and/or a height of an opening 235 into the OCP bay, as the nonstandard OCP module 220 can be installed in the bay from a position perpendicular to (above) the OCP rails 231.

As illustrated in FIGS. 2-6, examples of one or more fasteners 250 are presented. In these examples, fastener 250 includes a driver portion 251 and a fastener point 252. In this example, fastener 250 is helically threaded. In some other examples, fastener 250 may include clips, clamps, rivets, and the like. In other examples, fasteners 250 are omitted and card holders 210 and 215 are attached to module 220 by other fastening techniques, such as adhesives, solder, friction-fitting, etc.

As shown in the exploded view of FIG. 2, in this example of assembly 280 the adapter 200 includes the first card holder 210 and the second card holder 215. First and second card holders 210/215 are examples of first and second card holders 110/115. Although, as mentioned above, the first and second card holders 110/115 may differ from each other in terms of the materials they are made of, shapes of components, and the like, in the examples in reference to FIGS. 2-6 both card holders 210/215 are the same. As such, individual components of both card holders 210/215 will be same in these examples. It should be noted that these are provided as examples for ease of description, as such the card holder, and combinations thereof, may differ from each other.

The example first card holder 210 includes an attachment portion 211, an engagement feature 212 and a flexible portion 213, and the example second card holder 215, which includes an attachment portion 216, an engagement feature 217 and a flexible portion 218. Attachment portion 211/216, in this example, includes an attachment aperture 201. To attach the adapter 200 to the nonstandard OCP module 220, fastener 250 is inserted through the attachment aperture 201 and a fastener receiver 224. As shown in FIGS. 6A and 6B, the attachment portion 211 is placed under the nonstandard OCP module 220, in the direction of the dashed-line arrow, in a position where the attachment aperture 201 aligns the fastener receiver 224. Once aligned, the fastener penetrates the fastener receiver 224 and attachment aperture 201. Fastener receiver 224 and/or attachment aperture 201 may include threads. In the examples in reference to FIGS. 3-7, attachment aperture 201 includes a thread extender 302. The thread extender 302 is an area protruding from the opposite side of the attachment aperture 201 that provides threads for securing the attachment portion 211/216 to the nonstandard OCP module 220 using a fastener 250. In some examples, nuts and washers may be used for securing the attachment portion 211/216 to the nonstandard OCP module 220. In those examples, the thread extender 302 may or may not be present. In some other examples, attachment portion 211/216 may include a clip, where the clip protrudes upwards from the attachment portion 211/216 through the fastener receiver 224 and a second piece attaches to the clip as to secure the attachment portion 211/216 to the nonstandard OCP module 220.

Figure 7A:
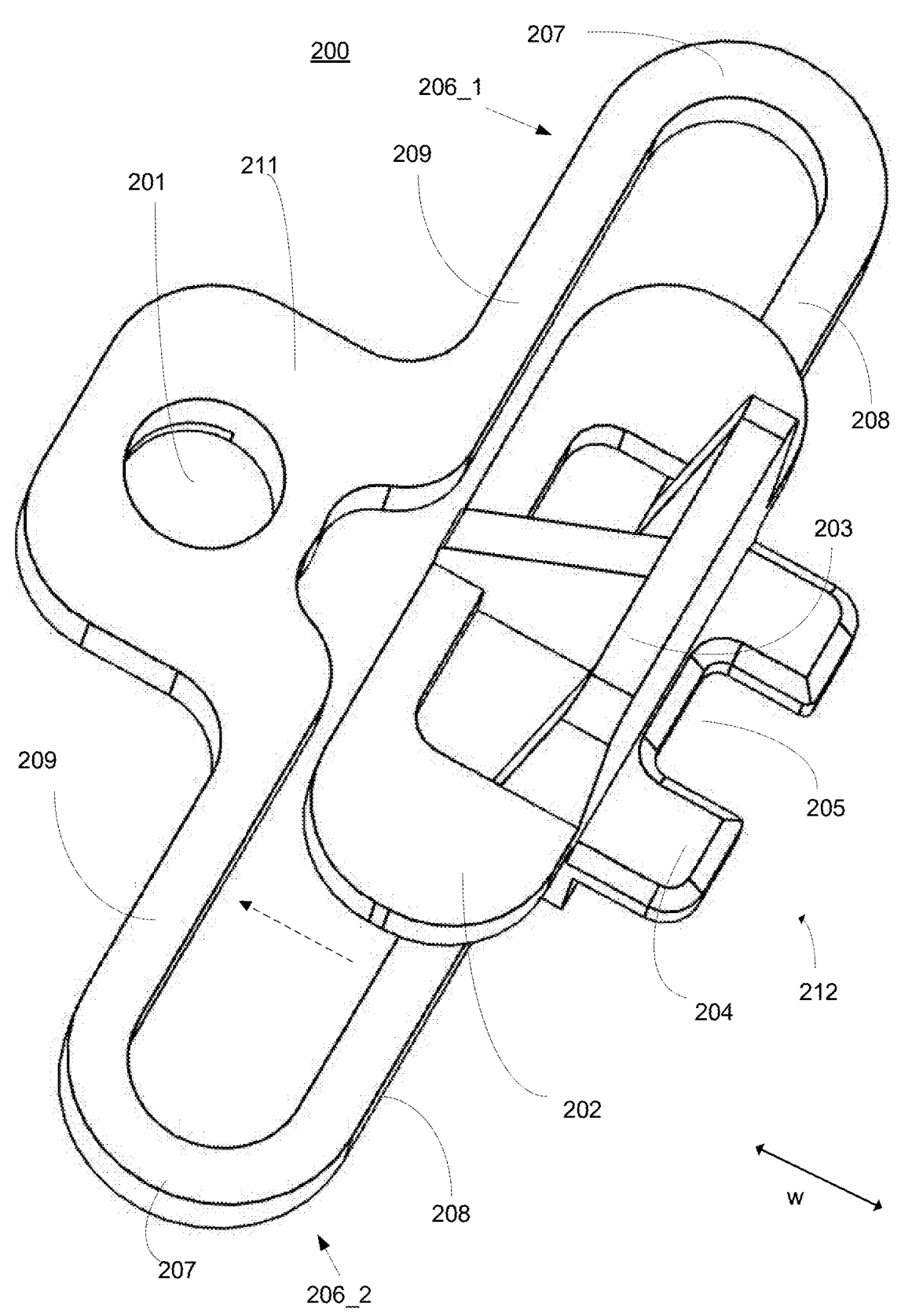
FIG. 7A is a perspective view of the top of one card holder of the adapter of FIG. 2.
Figure 7B:
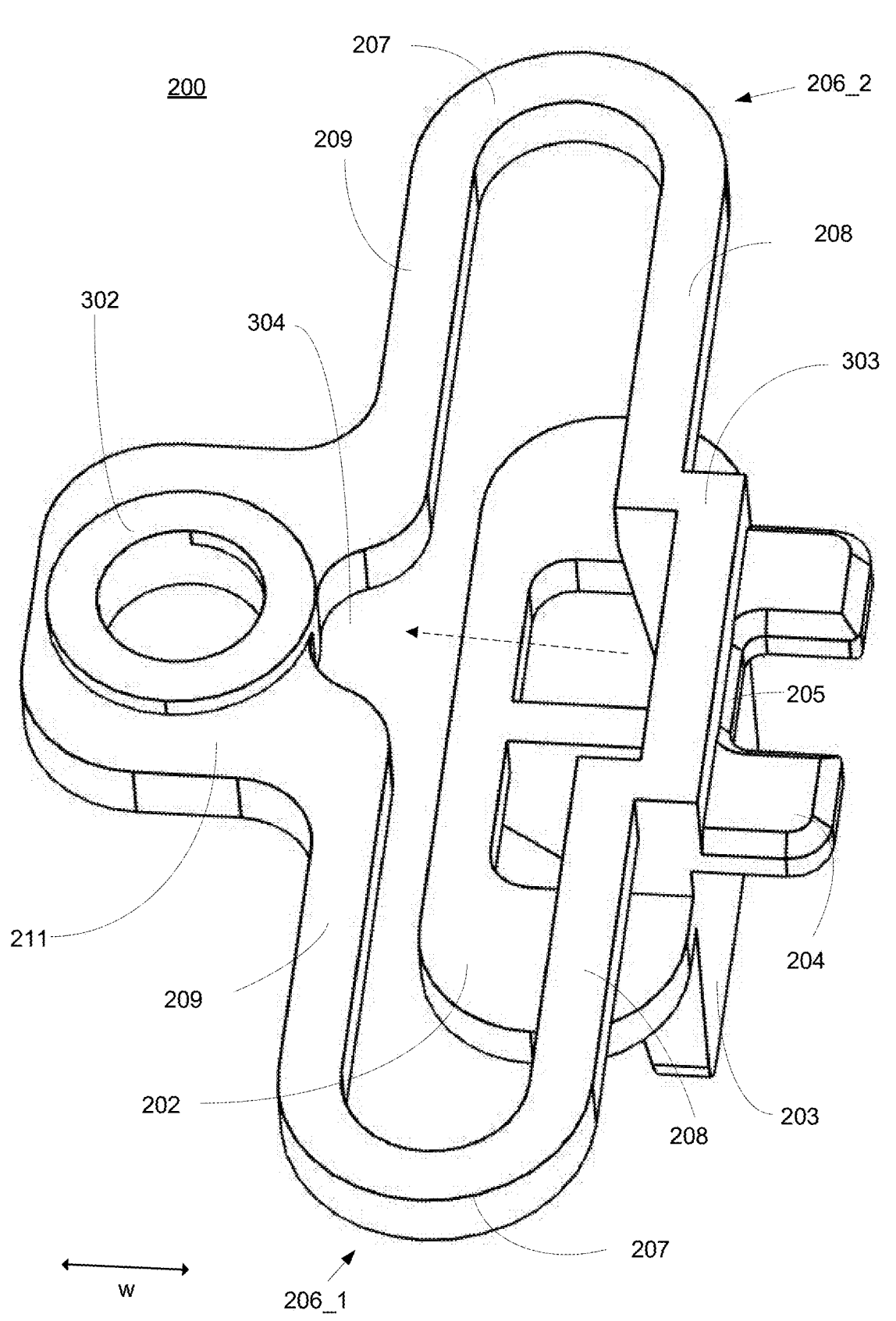
FIG. 7B is a perspective view of the bottom of one card holder of the adapter of FIG. 2.

The example engagement feature 212/217, referring to FIGS. 2, 7A and 7B, includes a support plate 202, a force pad 203, a rail engagement 204 and a lock engagement 205. The support plate 202 provides structural support for nonstandard OCP module 220 while attached to attachment portion 211/216 by constraining the upwards movement of the nonstandard OCP module 220. For example, without the support plate 202, wobbling movements, or movements upwards, of nonstandard OCP module 220 would put pressure on the fastener 250, fastener receiver 224, attachment aperture 201 and/or thread extender 302. As previously mentioned in this disclosure, directional positions and movements of assembly 280, and its components, are described in relation to OCP bay and OCP rails 231 as illustrated in the figures, with up referring to a direction parallel to direction 287 in FIG. 2, down referring to a direction opposite that of direction 287, rearward referring to a direction parallel to direction 288 and pointing towards opening 345, forward referring to a direction parallel to direction 288 and pointing towards connector 341, and lateral referring to directions parallel to direction 289. However, these directional terms do not imply any positional relationship relative to any external reference frame (such as the earth) or relative to gravity. Thus, for example, if the OCP rail 231 is located perpendicular to the ground, in this case any "upwards" movement of assembly 280 would be a movement that is parallel to the ground. It should be understood that depending on the configuration of the OCP rails 231, gravity may apply pressure that causes an "upwards" movement of the assembly 280, and in such cases, support plate 202 would reduce pressure applied on the fastener 250, fastener receiver 224, attachment aperture 201 and/or thread extender 302.

The example force pad 203 is used for moving the engagement feature 212/217 from the extended position to the contracted position. For example, a user may push the force pad 203 of engagement feature 212 inwards towards the first lateral side 221. When this movement occurs, force pad 203 traverses the length of the first deformation zone 225. The example rail engagement 204 is configured to engage with the OCP rails 231 by extending into the grooves 232 thereof when engagement feature 212/217 is in an extended position. For example, referencing FIG. 4B, example rail engagements 204 are shown in an engaged position with grooves 232 of OCP rails 231.

As shown in FIGS. 2, 7A, and 7B, each card holder 210, 215 also includes the lock engagement 205. Standard OCP modules often include notches that are used for locking the OCP module to OCP rails as to ensure that OCP connectors and respective sockets stay connected and to further prevent stress on the OCP sockets, such as by constant movements of connector while connected to the socket. The example lock engagement 205 provides the same locking capability to the nonstandard OCP module 220 by receiving a fastener of the module lock 237 of an OCP rail 231, with rail engagements 204 abutting opposite sides of the fastener such that the fastener prevents the rail engagements 204 from translating along the rail 231.

Referencing FIGS. 2, 7A, and 7B, example first card holder 210 includes flexible portion 213 and example second card holder 215 includes flexible portion 218. Flexible portion 213/218 includes a first flexible arm 206_1 and a second flexible arm 206_2, which connect the attachment portion 211/216 to the engagement features 212/217. Each flexible portion 213/218 includes two straight segments 208 and 209 and a curved segment 207 interconnecting the two straight segments 208 and 209, thus forming a U-shape when viewed from above. In the examples, referring to FIGS. 3 and 5-7, the straight segments 208/209 may also be referred to herein as a bending section 208 and a receiving section 209. The bending section 208, as shown in FIG. 6D, bends inwards towards the attachment portion 211/216 when engagement feature 212/217 is moved into a retracted position (along the width axis). Although FIG. 6D illustrates only the bending section 208 being bent, it should be noted that first flexible arm 206_1, a second flexible arm 206_2 and receiving section 209 would also bend depending on the force being applied to force pad 203.

Referencing FIGS. 3C-B, 5B, 6B, 6D and 7B-C, in these examples the engagement feature 212/217 includes an engagement base 303. The engagement base 303 is an intersecting section of engagement feature 212/217 and flexible portions 213/218 that provides structural support for moving engagement feature 212/217 to a retracted position. In instances, engagement base 303 has a non-flexible form. For example, engagement feature 212/217 has a base that is wider than the top, which provides structural support as to prevent engagement feature 212/217 from bending. In some instances, engagement feature 212/217, and by extension engagement base 303, may be made of a non-flexible material. As shown in FIG. 6D, when engagement feature 212/217 is in a retracted position, the engagement base 303 maintains its form while other components of flexible portions 213/218 may deform based on a force being applied to force pad 203.

The receiving section 209, provides some flexibility by moving slightly when engagement feature 212/217 is moved the whole length of deformation zone 225/226, and also functions as a connecting piece between the attachment portion 211/216 and the other components of the flexible portions 213/218. It should be noted that all components of flexible portions 213/218 may flex and provide the biasing force moving the engagement feature 212/217 into the extended position. For example, when engagement feature 212 is in a retracted position, by a pressure being applied to the force pad 203, stress is created on the first flexible arm 206_1 and the second flexible arm 206_2, resulting in elastic deformation thereof and the generation of an elastic (spring) force opposing the pressure. Once that pressure being applied to force pad 203 goes away, the elastic force is no longer opposed and thus is able to return the first flexible arm 206_1, the second flexible arm 206_2 to their natural state, thus moving engagement feature 212 back into the extended position. Thus, the flexible portions 213/218 bias the engagement features 212/216 to the extended position. Referring to FIGS. 3C-D, 5B, 6B, 6D and 7AB, in these examples receiving section 209 further includes a bending extender 304. As used herein, a "bending extender" is a receding section, or curvature, of the receiving section 209 that allows for bending further towards attachment portion 211/216. In some examples, bending extender 304 may not be included. For example, depending on the flexibility of the flexible portions 213/218, bending extender 304 may not be necessary for deforming the whole length of deformation zone 225/226.

A process of installing/removing the assembly 280 in the bay will now be described with reference to FIGS. 3A-3D. As shown in FIG. 3A, the process of installation begins by positioning the assembly 280 vertically above the space 233 between the rails 231. Next, the adapter 200 is placed in the first state by moving the engagement features 212/216 laterally inward towards each other until they reach the retracted positions (e.g., by applying pressure to the force pads 203). With the adapter 200 in the first state, the assembly 280 is moved downward into the space 233 between rails 231. When the rail engagements 204 of the engagement features 212/216 are horizontally aligned with the grooves 232 of the rails 231, the adapter 200 is placed in the second state by moving the engagement features 212/216 laterally outwards until they reach the extended positions (e.g., by releasing pressure from the force pads 203). This causes the rail engagements 204 to engage with (insert into) the grooves 232, resulting in the state illustrated in FIGS. 3B and 3C (FIG. 3B showing a top view and FIG. 3C showing a bottom view). Next, as suggested by the arrows in FIGS. 3C and 3D, once adapter 200 is attached to nonstandard OCP module 220 and in the second state, module 280 is moved along the length of the rails 231 (I axis) in the direction of the OCP system socket 341 (dashed arrow), until OCP connector 223 connects to the OCP system socket 341. When the OCP connector 223 connects to the OCP system socket 341, as shown in FIG. 3D, the assembly 280 is in the installed state. The removal of the assembly 280 may be achieved by reversing the actions described above.

Figure 4B:
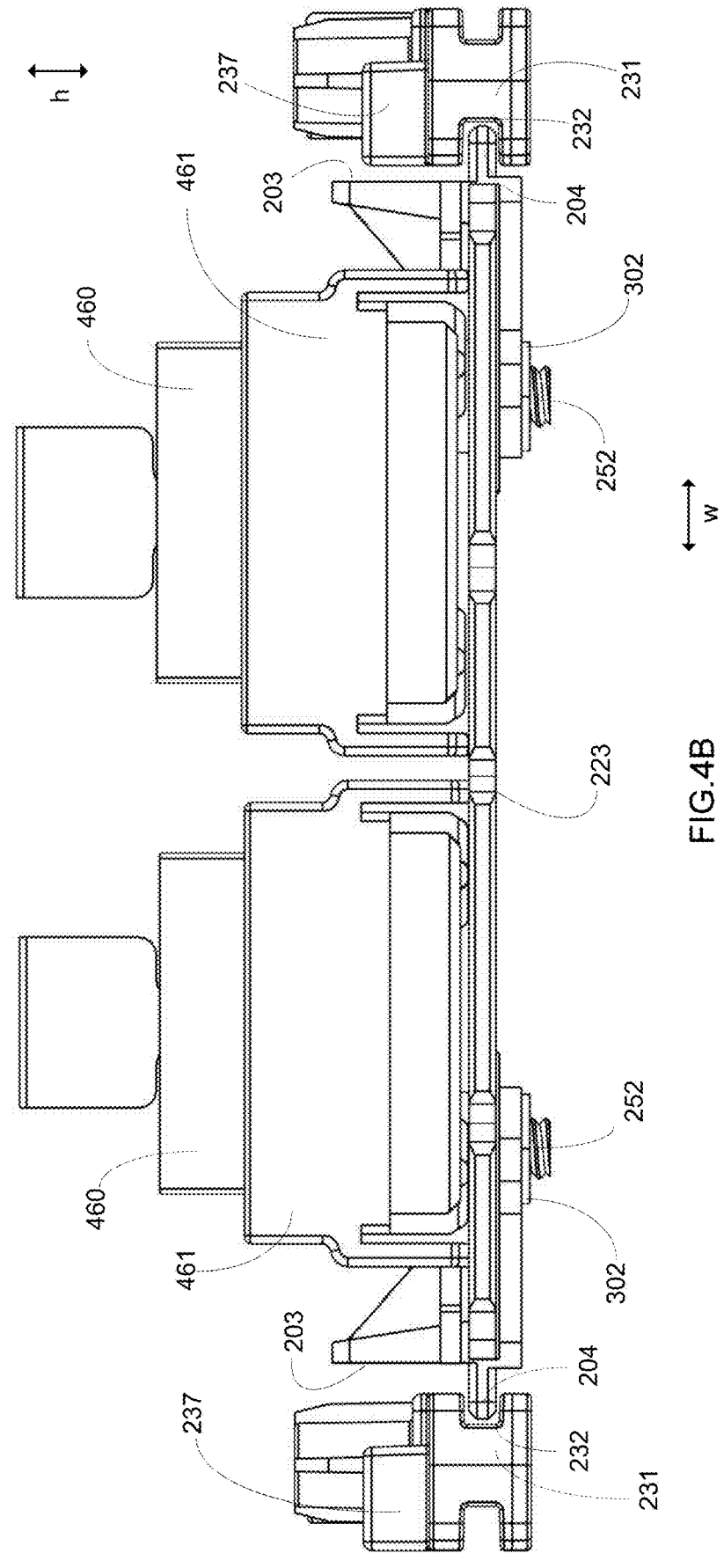
FIG. 4B is a front plan of the assembly and OCP bay of FIG. 2, with a module component connected to the nonstandard OCP module.

Referring now to FIG. 4A-B, front and side views of example OCP rails 231 and assembly 280 with module component 460 connected to component socket 461 are shown. As shown in these figures, when module component 460 connected to component socket 461, the height of the nonstandard OCP module 220 (h axis) exceeds the height d of the opening 235 of the chassis and or OCP bay (not shown), which would prevent the module 220 from being inserted into the bay through the opening 235 along a direction parallel to the length of the rails 231 (I axis). In some examples, module component 460 may be integrated into the nonstandard OCP module 220, but the height may nonetheless exceed the dimensions used according to OCP guidelines. In either scenario, the use of the adapter 200 would allow for the nonconforming module, such as module 220, to be engaged with the OCP rails 231 and connected to an OCP system socket without being inserted through the opening 235 but rather by insertion vertically from above (e.g., through an open lid of the chassis).

Figure 5A:
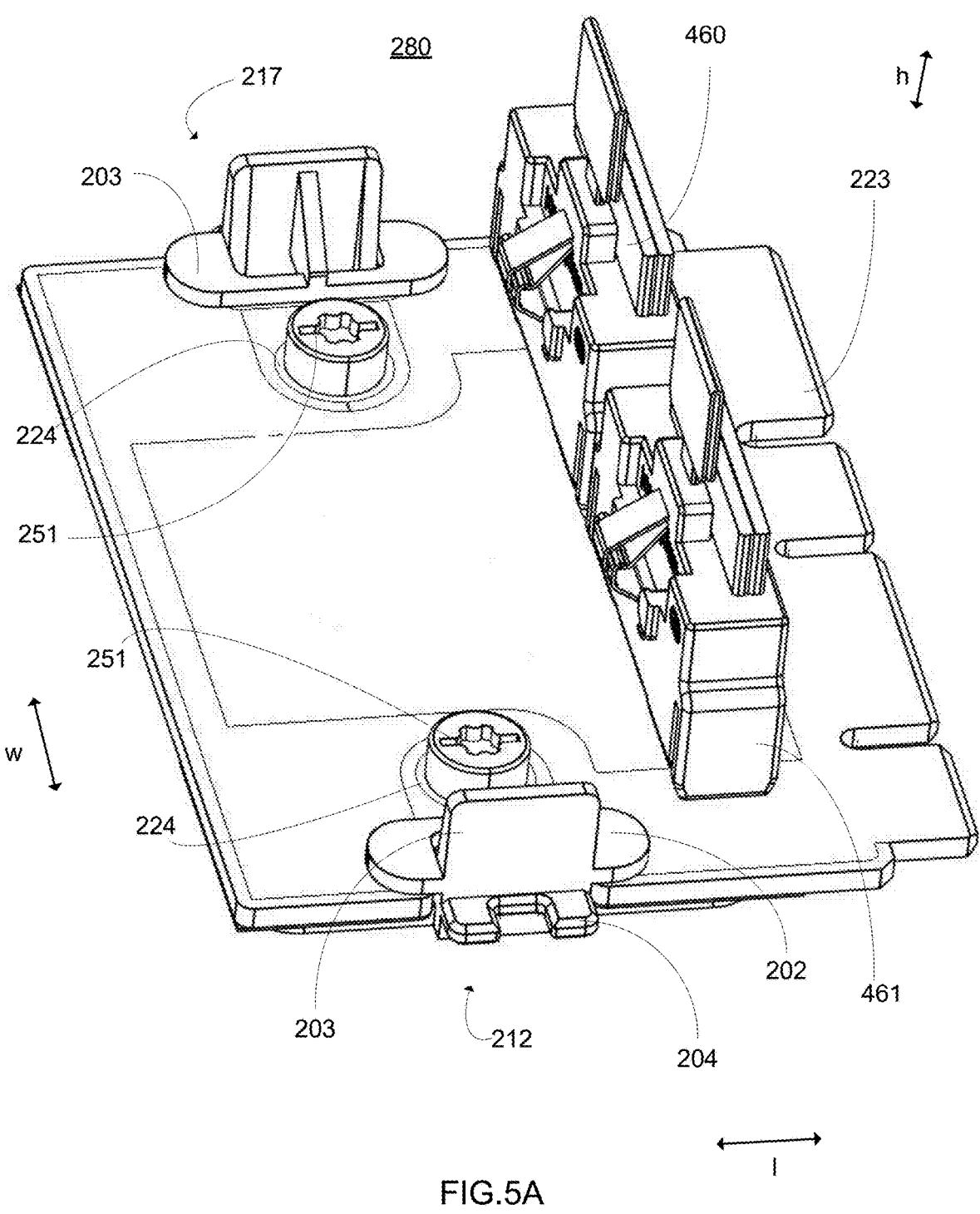
FIG. 5A is perspective view of the top of the assembly of FIG. 2, with a module component connected to the nonstandard OCP module.
Figure 5B:
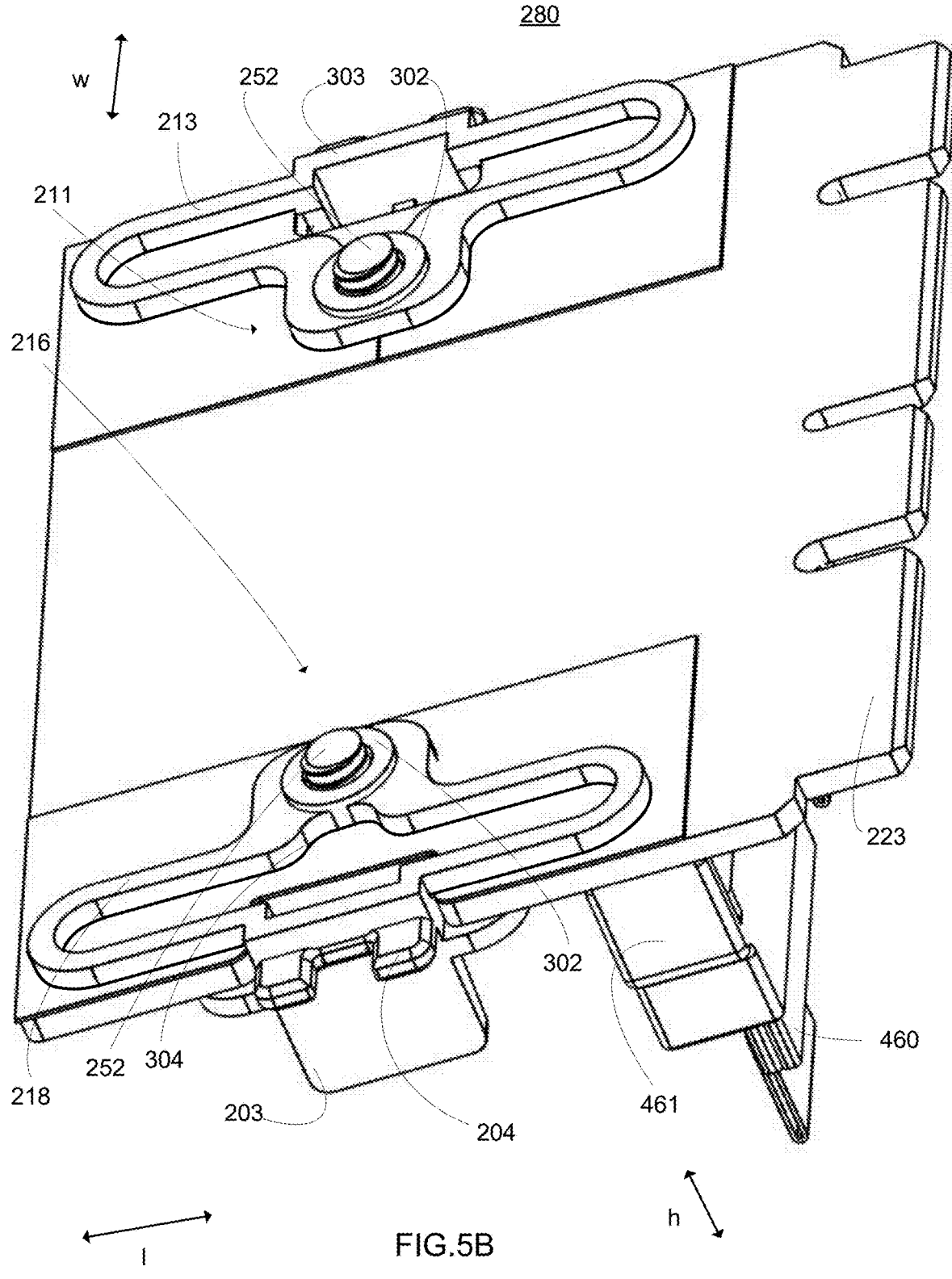
FIG. 5B is perspective view of the bottom of the assembly of FIG. 2, with a module component connected to the nonstandard OCP module.
Figures 6A, 6B:
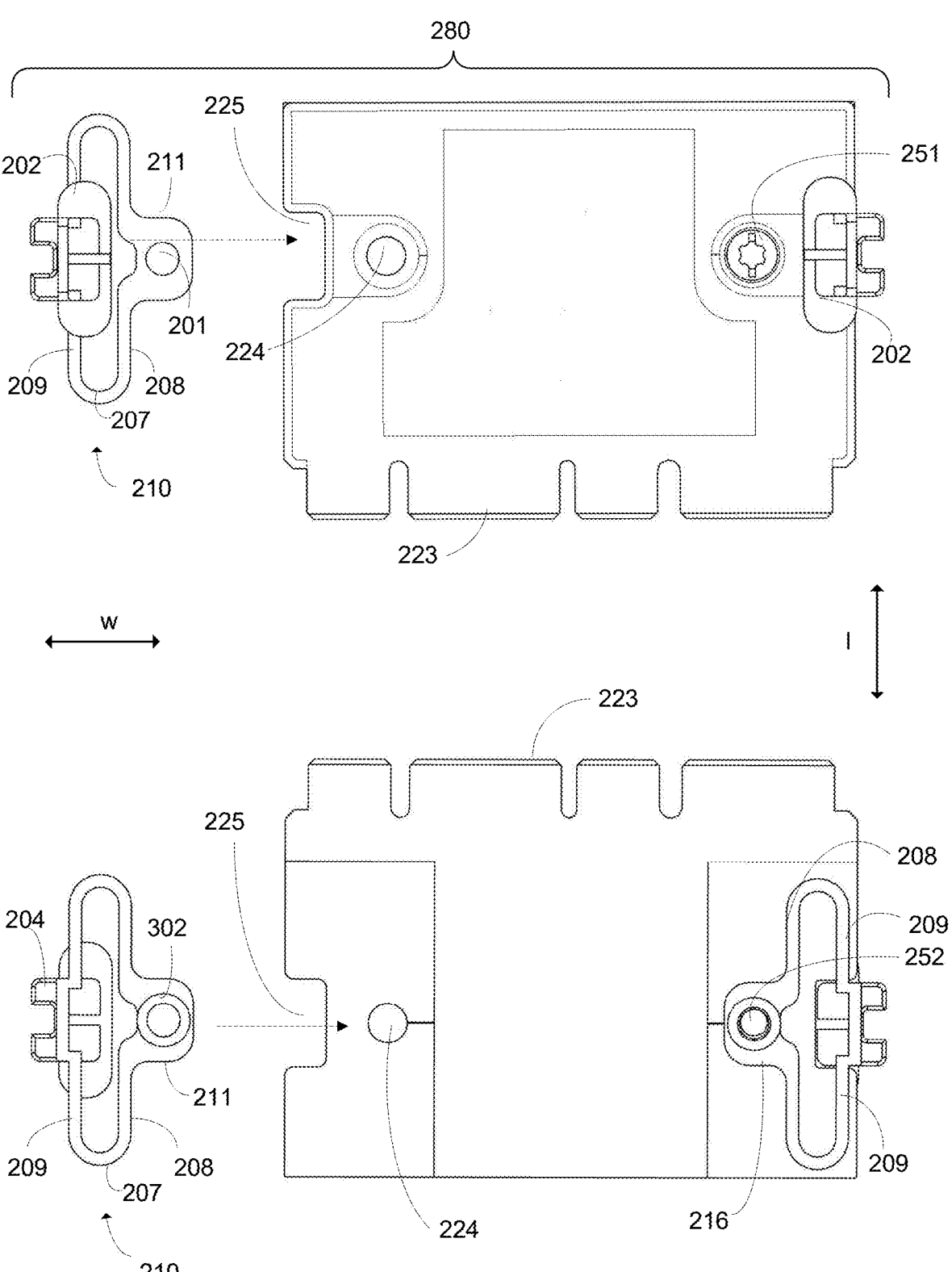
FIG. 6A is a top plan of the assembly of FIG. 2 showing an attachment of one of the card holders of the adapter to the nonstandard OCP module.
FIG. 6B is a bottom plan of the assembly of FIG. 2 showing an attachment of one of the card holders of the adapter to the nonstandard OCP module.
Figures 6C, 6D:
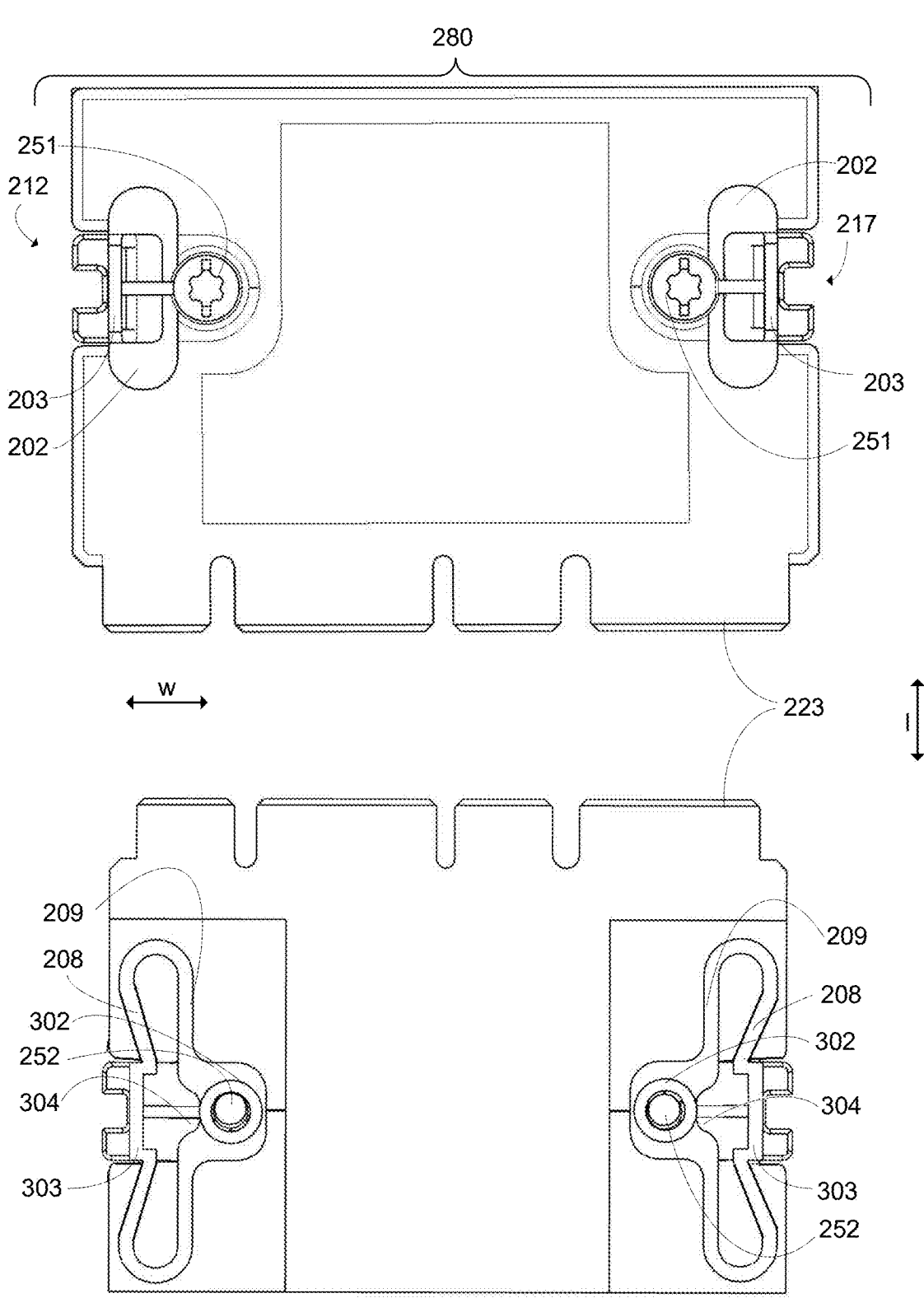
FIG. 6C is a top plan of the assembly of FIG. 2 showing attachment features in a retracted position.
FIG. 6D is a bottom plan of the assembly of FIG. 2 showing attachment features in a retracted position.

Now referring to FIGS. 5A-B, perspective views of top and bottom of assembly 280 with module component 460 connected to component socket 461 are shown. As shown in FIG. 5A, a driver portion 251 of fastener 250 is used to drive the helical threads of the fasteners 250 through the fastener receivers 224 of the nonstandard OCP module 220. As shown in FIG. 5B, a fastener point 252 of fastener 250 is used to begin the threading motion through the thread extender 302 of the attachment portion 211/216. In instances, thread extender includes helical threads for receiving a fastener 250. In some instances, both fastener receiver 224 and thread extender 302 may include helical threads for receiving a fastener 250. For example, fastener receiver 250 of nonstandard OCP module 220 may be an opening wide enough for allowing fasteners 250 of multiple sizes through while not allowing the driver portion 251 through. In this example, nonstandard OCP module 220 would allow for the use of adapters 200 of different sizes, since the threading movement is only needed on the adapter 200. In some other examples, nonstandard OCP module 220 and adapter 200 may be custom fitted, which allows for a stronger attachment since both fastener receivers 224 and thread extender 302 provide threads.

Referring to FIGS. 6A-D, example first state and second state of adapter 200 are shown. FIG. 6A shows a top view, and FIG. 6B shows a bottom view, of assembly 208, with first card holder 210 not attached to nonstandard OCP module 220 and second card holder 215 attached to nonstandard OCP module 220 with engagement feature 217 in an extended position. FIG. 6C shows a top view, and FIG. 6D shows a bottom view, of first and second card holders 210/215 attached to the nonstandard OCP module 220 with engagement features 212/217 in a retracted position. As shown in the example, the engagement features 212/217 are moved into a retracted position by moving along the width axis "w" toward the attachment portion 211/216.

Figure 7C:
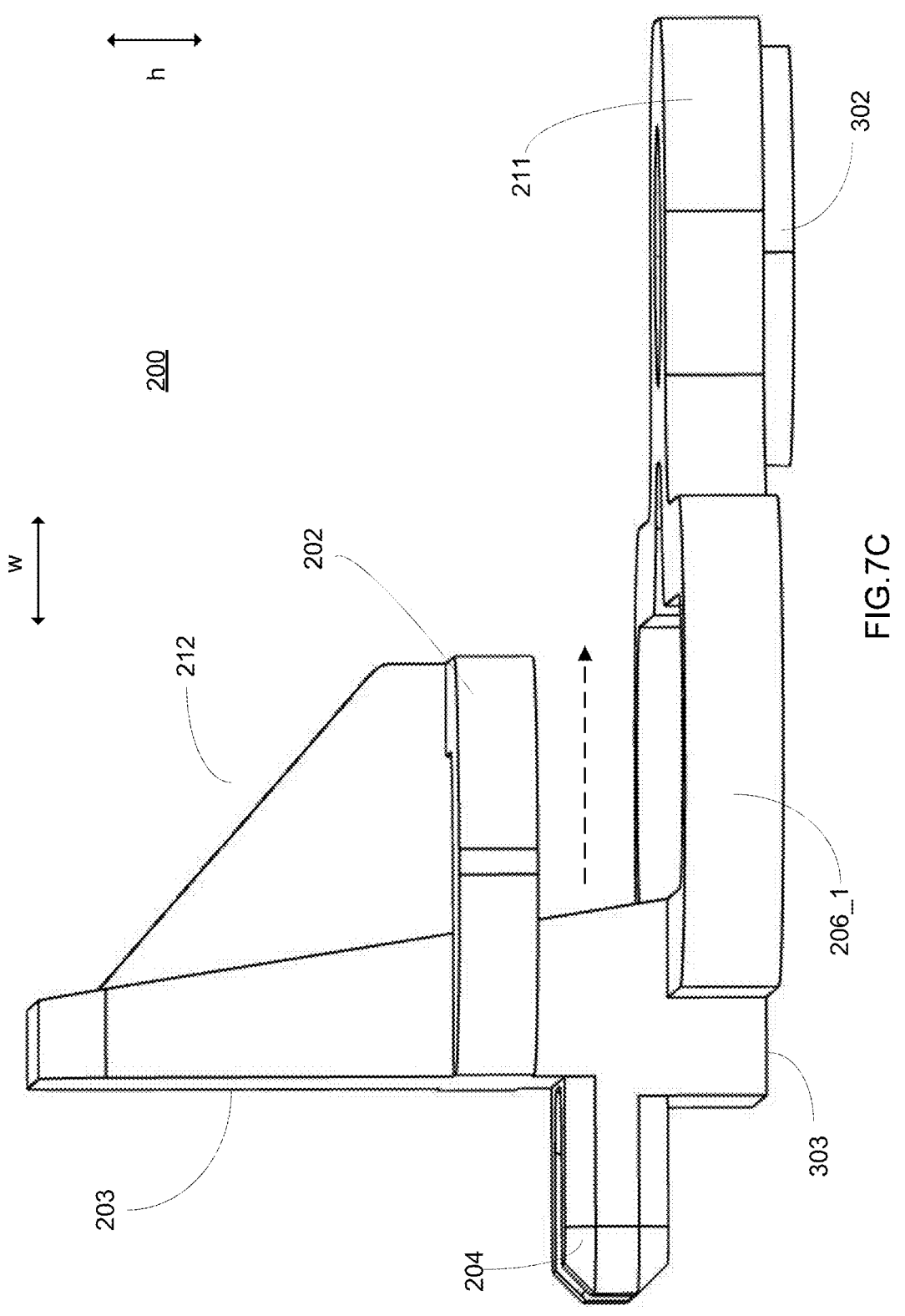
FIG. 7C is a perspective view of a side of one card holder of the adapter of FIG. 2.
Figure 7D:
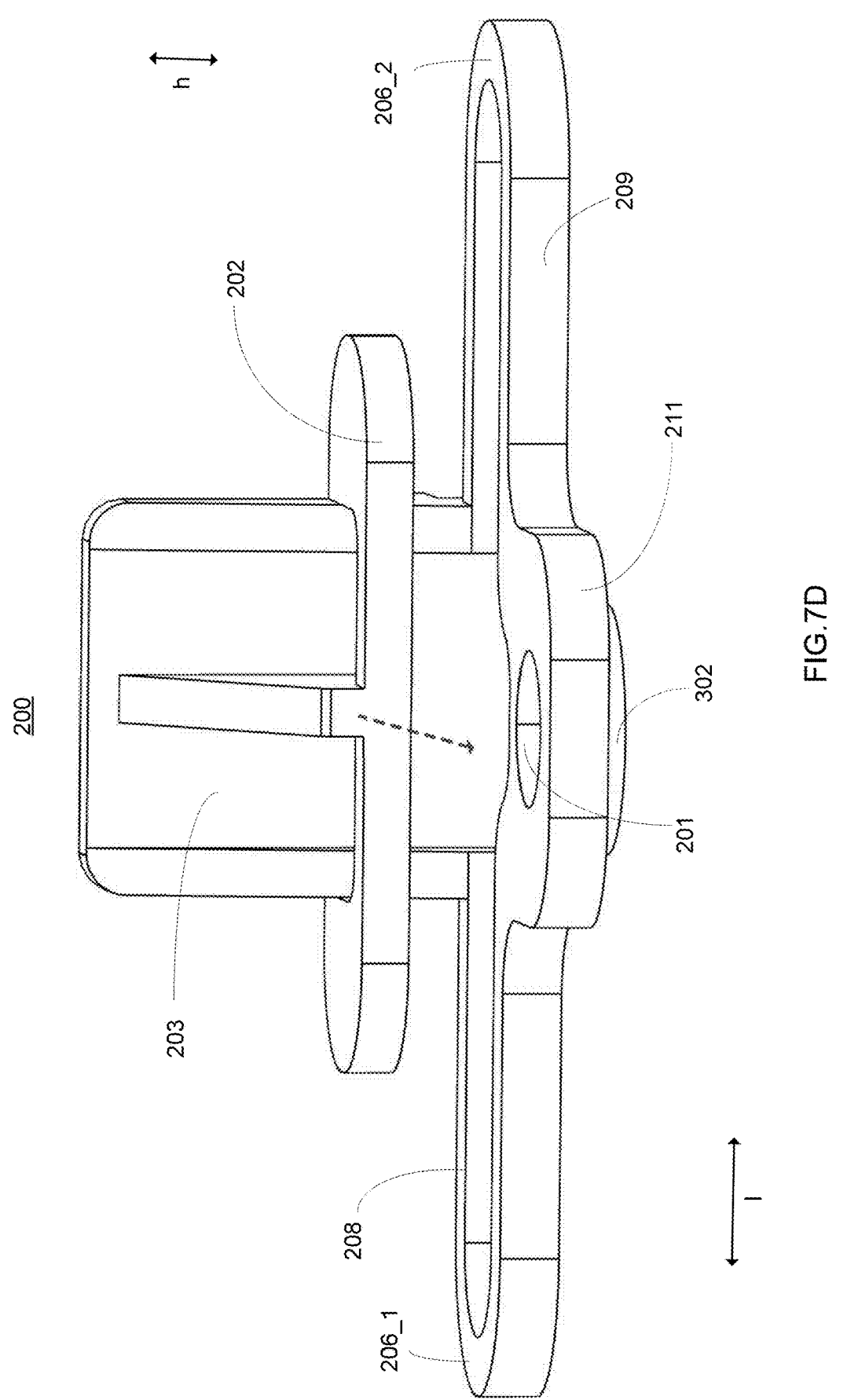
FIG. 7D is a perspective view of another side of one card holder of the adapter of FIG. 2.

Referring to FIG. 7A-D, perspective views of adapter 200 are presented. Adapter 200 is described in the context of the first card holder 210 for ease of description, as such the examples may also include second card holder 215, a third card holder and so on. FIG. 7A show a perspective view of the top of the adapter 200, with the dashed arrow showing the movement of the engagement feature 212 along the width axis. FIG. 7B shows the same movement along the width axis as a perspective view of the bottom of the adapter 200. FIG. 7C shows the same movement along the width axis in a perspective view of a side of the adapter 200. FIG. 7D also shows the same movement in a perspective view of the nonstandard OCP module 220 (the side of the adapter 200 facing the nonstandard OCP module 220).

Figure 8:
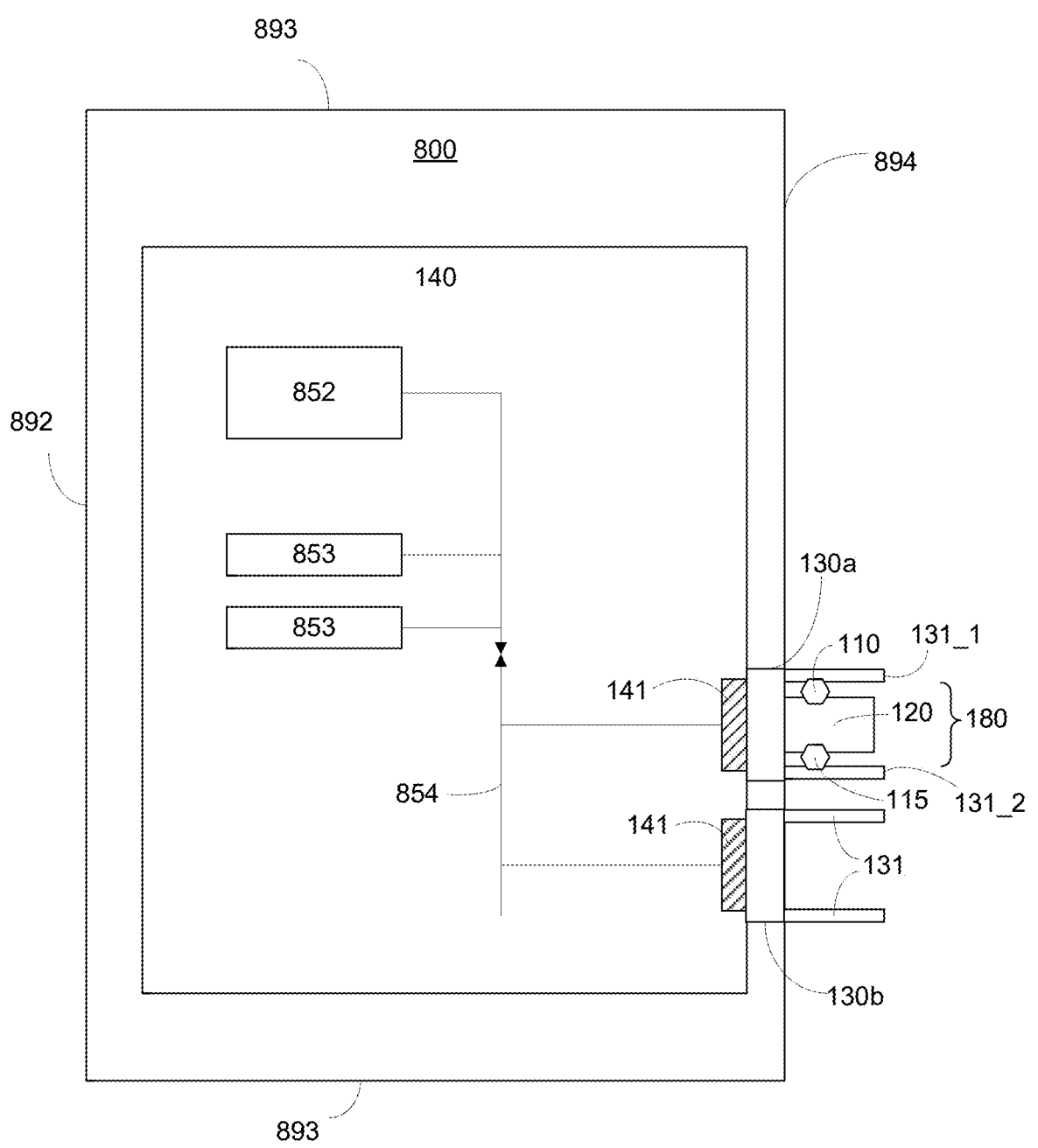
FIG. 8 is a block diagram illustrating an example system with a nonstandard OCP module installed using the OCP adapter.

Now referring to FIG. 8, a computing system 800 is presented. In instances, computing device 800 includes a chassis. A "chassis," as used herein, is an enclosure designed to house and support hardware components. The chassis includes a front panel 892, side panels 893 and a rear panel 894. The chassis also includes bottom and top panel, which are omitted for illustrative purposes.

In instances, computing device 800 includes the system board 140. In some instances, computing system 850 may include a processor 852 mounted to system board 140. As used herein, a "processor" is a component configured for executing instructions, performing calculations and managing tasks. In instances, computing system 850 may include two or more processors 852 mounted to system board 140. In an example, without limitations, processor 852 may be a Central Processing Unit, (CPU).

Still referring to FIG. 8, in instances, computing system 800 includes at least a memory 853 mounted to system board 140. As used in this disclosure, a "memory" is a data storage component configured to store instructions for a computing component, such as processor 852. In examples, without limitations, memory 853 may be configured for temporary storage of data, such as a random-access memory (RAM), or permanent data storage, such as Solid-State drives (SSD).

In instances, continuing to refer to FIG. 8, processor 852 and/or memory 853 may communicate with each other via a bus 854. A "bus," as used herein, is a component configured for transmitting data. Bus 854 may include multiple types of bus structures, and combinations thereof, such as memory bus, memory controller, peripheral bus, local bus, and the like.

In instances, computing system 800 includes one or more OCP bays 130 disposed at or forming part of the rear panel 894. In instances, each OCP bay 130 includes OCP rails 131 configured to receive standard OCP modules and the assembly 180. Although only one pair of OCP rails 131 is illustrated per OCP bay 130, each OCP bay 130 may include a plurality of OCP rail 131 pairs and, as such, multiple assemblies 180 may be included in an OCP bay 130. In FIG. 8, two OCP bays 130a and 130b are illustrated, with the first OCP bay 130a is illustrated with first card holder 110 and second card holder 115 attached to a nonstandard OCP module 120, while the second OCP bay 130b is shown without an assembly 180 for illustrative purposes.

In instances, computing system 800 includes one or more OCP sockets 141. Each OCP socket 141 may be connected to, or a part of, the primary system board 140. Computing device 800 includes the assembly 180, which in this example is shown with first and second card holders 110/115 attached to nonstandard OCP module in an installed position. As described in this disclosure, the installed position is when engagement feature 112/117 (not shown) is in an extended position and OCP connector 123 (not shown) is connected to OCP system socket 141. In some instances, the computing system 800 may include two OCP system sockets 141 connected to one assembly 180, where the assembly includes on nonstandard OCP module 120 with two OCP connectors (not shown). In some instances, two OCP system sockets 141 may be attached, or part of, one OCP bay 130. For example, the two OCP system sockets 141 may include a primary socket configured to receive a 4C+ OCP connector and a secondary socket configured to receive a 4C OCP connector. In an example, assembly may include a nonstandard OCP module 120 that has two OCP connectors, similar to a long form factor OCP module.

Figure 9:
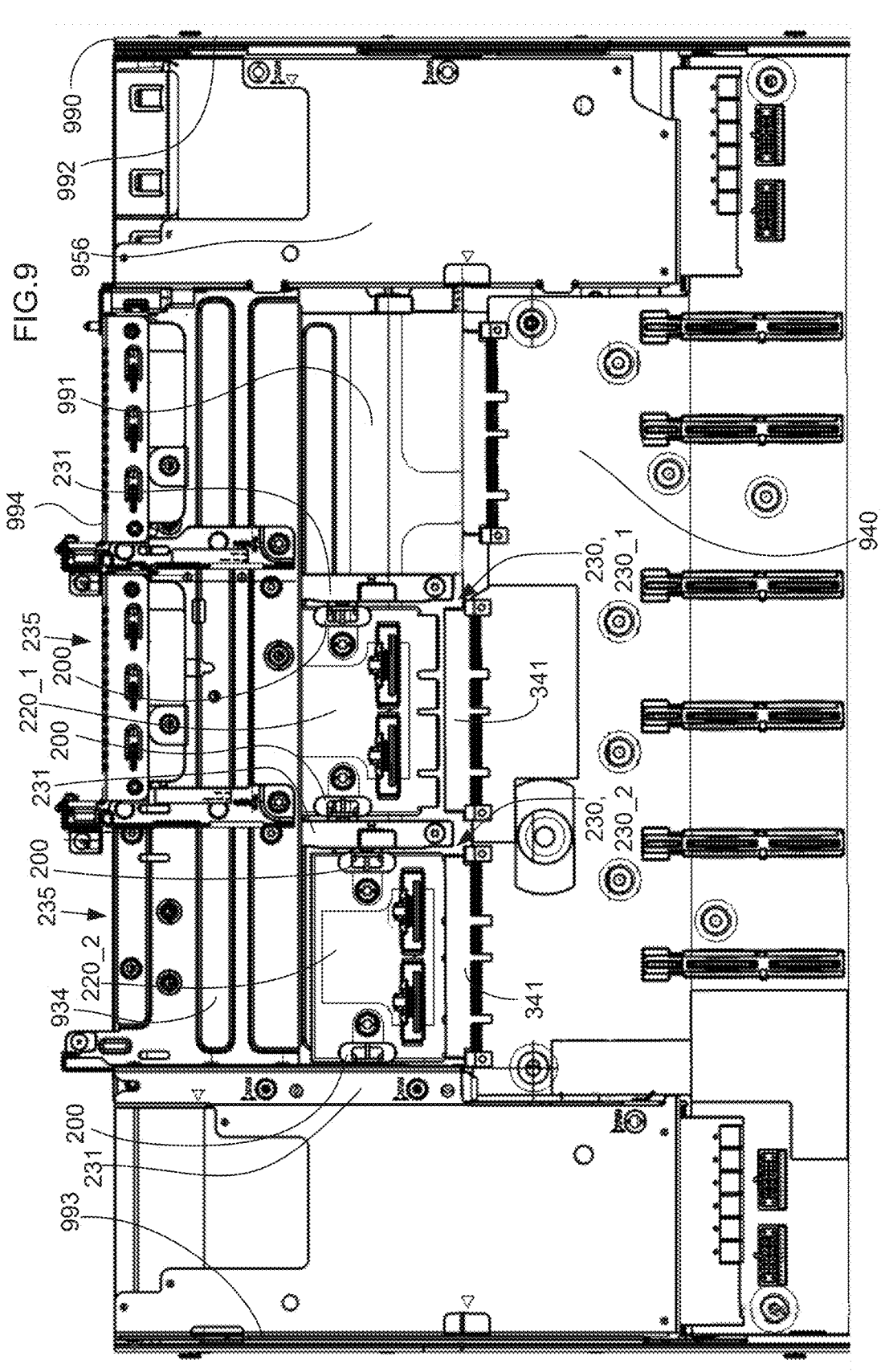
FIG. 9 is a perspective view of an example system comprising an example nonstandard OCP module using an example OCP adapter.

Now referring to FIG. 9, a top view of an example computing system 900 is presented. The computing system 900 includes a chassis 990 and a primary system board 940. In this example, only a rear portion of the chassis 900 and a rear section of the primary system board 940 is shown for illustrative purposes. The computing system 900 is one example of the computing system 800, and the primary system board 940 is one example of the primary system board 140. The primary system board 940 includes a processor and memory, but these are not visible in FIG. 9. The chassis 990 includes a basepan 991, lateral walls 992/993, and a rear panel 994, as well as a front panel (not visible) and cover (removed to allow visibility of internal components). This example also includes a power supply unit 956. In this example, the chassis 990 also includes various internal support structures, including an internal horizontal bay divider wall 934.

As shown in FIG. 9, the computing system 900 also includes OCP rails 231, which are attached to the basepan 991 of the chassis 990. These OCP rails 231 define OCP bays 230 therebetween. In FIG. 9, three OCP rails 231 are illustrated which define two OCP bays 230—OCP bay 230_1 and OCP bay 230_2—therebetween. An additional OCP bay may be provided adjacent to these for receiving an DC-SCM, which is omitted from the view. The horizontal bay divider wall 934 rests on top of the OCP rails 231 and is attached thereto. The diver wall 934 may vertically separate the OCP bays 230 from an upper story of additional bays, which may receive other components such as riser cages carrying expansion cards, storage drives, or other removable modules (not illustrated). The rear panel 994 has apertures therein corresponding to openings 235 in the bays 230. In this example, adapters 200, nonstandard OCP module 220, OCP socket 341 and module component 460 connected to component socket 461 are shown to provide further context. See FIGS. 3C-B and 4A-B for examples of these components and their interactions. As shown in this example, the divider wall 934 may form partially enclosed sections that limits the dimensions of modules that can be inserted into the bays 230. As this enclosed section dimensions follow the OCP standards, the OCP bays 230 can receive standard OCP modules. However, this enclosed section prevents a nonstandard OCP module 220 with an attached module component 460 from being inserted directly through the opening 235 in the rear panel 994 if the height of the module component 460 is above standard OCP dimensions. However, the nonstandard OCP modules 220 can be inserted into the bays 230 by moving the modules 220 vertically past the front edge of the divider wall 934 down into the bays 230, as described above.

Similar to FIGS. 3C and 3D, a first nonstandard OCP module 220_1 is shown engaged with rails 231 in OCP bay 230_1 but in an uninstalled position while a second nonstandard OCP module 220_2 is shown in an installed position in OCP bay 230_2. As it will be apparent to one of ordinary skill, upon reading this disclosure, that the nonstandard OCP module 220 can be placed directly on the OCP rails 231 by using the adapters 200, which allows for the use of module components 460 that are above the dimensions of the opening of the OCP bay 230. It should be noted that in some instances, the dimension limitation may also be imposed by a section of the chassis. For example, some chassis may include a plate above the OCP bay 230 near the rear panel 994, which further imposes dimension limitations of the modules inserted directly at the rear panel 994. In some examples, computing system 900 may also include non-OCP connectors placed above the OCP bays 230. Since, unlike OCP sockets 341, these non-OCP connectors do not connect directly to the primary board 940 and sit closer to the rear panel 994. It should be noted that these are only limited examples of dimension restrictions that make the use of OCP adapters 200 desirable, and that many other examples not discussed may exist.

In instances, a method is presented. The method includes inserting assembly 180 into a chassis of an information processing device by movement vertically through a top opening of the chassis. The method further includes placing the assembly 180 immediately above OCP rails 131. The method also includes attaching the assembly 180 to the OCP rails 131 by moving engagement features 112/117 of the adapter 100 to retracted positions in which there is clearance between the engagement features 112/117 and the OCP rails 131, moving the assembly 180 downward past top surfaces of OCP rails 131 into a space between OCP rails 131 until the engagement features 122/117 are aligned with grooves in the OCP rails 131 and moving the engagement features 112/117 of adapter 200 to extended positions in which the engagement features 112/117 extend into the grooves of the OCP rails 131.

The method further includes connecting an OCP connector 123 of the nonstandard OCP module 120 to an OCP system socket 141 attached to a system board 140 of the information processing device by sliding the engagement features along the grooves of the OCP rails 131. In instances, the method may include moving the engagement features 112/117 to the retracted positions by applying pressure to a protruding component of the adapter 100 and moving the engagement features 112/117 to the extended positions by releasing the pressure from the protruding component of the adapter 100. In some examples, the protruding component may be a force pad 203.

In the description above, various types of electronic circuitry are described. As used herein, "electronic" is intended to be understood broadly to include all types of circuitry utilizing electricity, including digital and analog circuitry, direct current (DC) and alternating current (AC) circuitry, and circuitry for converting electricity into another form of energy and circuitry for using electricity to perform other functions. In other words, as used herein there is no distinction between "electronic" circuitry and "electrical" circuitry.

It is to be understood that both the general description and the detailed description provide examples that are explanatory in nature and are intended to provide an understanding of the present disclosure without limiting the scope of the present disclosure. Various mechanical, compositional, structural, electronic, and operational changes may be made without departing from the scope of this description and the claims. In some instances, well-known circuits, structures, and techniques have not been shown or described in detail in order not to obscure the examples. Like numbers in two or more figures represent the same or similar elements.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise. Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Elements and their associated aspects that are described in detail with reference to one example may, whenever practical, be included in other examples in which they are not specifically shown or described. For example, if an element is described in detail with reference to one example and is not described with reference to a second example, the element may nevertheless be claimed as included in the second example.

Unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within ±1% of the stated value, property, or relationship unless indicated otherwise.

Further modifications and alternative examples will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various examples shown and described herein are to be taken as exemplary. Elements and materials, and arrangements of those elements and materials, may be substituted for those illustrated and described herein, parts and processes may be reversed, and certain features of the present teachings may be utilized independently, all as would be apparent to one skilled in the art after having the benefit of the description herein. Changes may be made in the elements described herein without departing from the scope of the present teachings and following claims.

It is to be understood that the particular examples set forth herein are non-limiting, and modifications to structure, dimensions, materials, and methodologies may be made without departing from the scope of the present teachings.

Other examples in accordance with the present disclosure will be apparent to those skilled in the art from consideration of the specification and practice of the invention disclosed herein. It is intended that the specification and examples be considered as exemplary only, with the following claims being entitled to their fullest breadth, including equivalents, under the applicable law.

What is claimed is:

1. An adapter comprising:
a first card holder configured to be coupled to a first lateral side of a nonstandard Open Compute Project (OCP) module to facilitate installation of the nonstandard OCP module in an OCP bay of an information processing device, the OCP bay comprising a pair of OCP rails comprising grooves, wherein the pair of OCP rails extends along a horizontal axis and is separated laterally by a separation distance,
wherein the first card holder comprises:
an attachment portion configured to attach to the nonstandard OCP module; and
an engagement feature coupled to the attachment portion and movable between an extended position and a retracted position;
wherein in a first state of the adapter, the engagement feature of the first card holder is in the retracted position and an assembly of the adapter and the nonstandard OCP module has a widest lateral extent less than the separation distance such that the assembly is movable vertically into or out of a space between the OCP rails; and
wherein in a second state of the adapter, the engagement feature of the first card holder is in the extended position and engaged with the groove of a first OCP rail to secure the assembly to the first OCP rail.

2. The adapter of claim 1, wherein the first card holder further comprises a flexible portion which couples the engagement feature to the attachment portion, the flexible portion configured to, in response to movement of the engagement feature to the retracted position, elastically deform and generate a biasing force urging the engagement feature towards the extended position.

3. The adapter of claim 2, wherein the flexible portion comprises two flexible arms each comprising a first straight segment, a second straight segment, and a curved segment connecting the first and second straight segments together.

4. The adapter of claim 1, wherein the engagement feature traverses the length of a first deformation area of the first lateral side when moving between the extended position and the retracted position.

5. The adapter of claim 1, wherein in the extended position the engagement feature protrudes a first distance laterally outward from the first lateral side of the nonstandard OCP module and in the retracted position the engagement feature does not protrude laterally outward from the first lateral side or protrudes laterally outward from the first lateral side a second distance which is less than the first distance.

6. The adapter of claim 1, wherein the adapter comprises a second card holder configured to be coupled to a second lateral side of the OCP module, wherein the second card holder comprises: an attachment portion configured to attach to the nonstandard OCP module; and an engagement feature coupled to the attachment portion and configured to, in the second state of the adapter, engage with the groove of a second OCP rail of the OCP rails to secure the assembly to the second OCP rail.

7. The adapter of claim 6, wherein the engagement feature of the second card holder is movable between an extended position and a retracted position; wherein in the first state of the adapter, the engagement feature of the second card holder is in the retracted position; and wherein in the second state of the adapter, the engagement feature of the second card holder is in the extended position and engaged with the groove of the second OCP rail.

8. The adapter of claim 7, wherein in the second state of the adapter, the widest lateral extent of the assembly is greater than the separation distance between the OCP rails.

9. The adapter of claim 7, wherein in the first state of the adapter, a distance between respective outer edges of the engagement features of the first and second card holders is less than the separation distance between the OCP rails, and in the second state of the adapter, the distance between respective outer edges of the engagement features of the first and second card holders is greater than the separation distance between OCP rails.

10. The adapter of claim 1, wherein in an installed state, the engagement feature of the first card holder is configured to engage with a module lock of the first OCP rail to secure an OCP connector of the nonstandard OCP module to an OCP socket in a connected position.

11. The adapter of claim 1, wherein the attachment portion of the first card holder comprises a thread extender configured to receive a fastener.

12. The adapter of claim 1, wherein the engagement feature of the first card holder comprises a support plate configured to reduce perpendicular movement of the nonstandard OCP module relative to the OCP rails.

* * * * *